(12) United States Patent
Isomura et al.

(10) Patent No.: US 9,614,155 B2
(45) Date of Patent: Apr. 4, 2017

(54) VAPOR DEPOSITION APPARATUS, VAPOR DEPOSITION METHOD, AND METHOD FOR PRODUCING ORGANIC ELECTROLUMINESCENT ELEMENT

(71) Applicant: Sharp Kabushiki Kaisha, Osaka-shi (JP)

(72) Inventors: Yoshiyuki Isomura, Osaka (JP); Katsuhiro Kikuchi, Osaka (JP); Shinichi Kawato, Osaka (JP); Satoshi Inoue, Osaka (JP); Takashi Ochi, Osaka (JP); Yuhki Kobayashi, Osaka (JP); Eiichi Matsumoto, Mitsuke (JP); Masahiro Ichihara, Mitsuke (JP)

(73) Assignee: SHARP KABUSHIKI KAISHA, Osaka-shi (JP)

( * ) Notice: Subject to any disclaimer, the term of this patent is extended or adjusted under 35 U.S.C. 154(b) by 0 days.

(21) Appl. No.: 14/903,603

(22) PCT Filed: Mar. 4, 2014

(86) PCT No.: PCT/JP2014/055407
§ 371 (c)(1),
(2) Date: Jan. 8, 2016

(87) PCT Pub. No.: WO2015/004945
PCT Pub. Date: Jan. 15, 2015

(65) Prior Publication Data
US 2016/0155944 A1 Jun. 2, 2016

(30) Foreign Application Priority Data
Jul. 8, 2013 (JP) ................................. 2013-142888

(51) Int. Cl.
*H01L 51/00* (2006.01)
*C23C 14/04* (2006.01)
(Continued)

(52) U.S. Cl.
CPC ........ *H01L 51/0011* (2013.01); *C23C 14/042* (2013.01); *C23C 14/12* (2013.01);
(Continued)

(58) Field of Classification Search
CPC . H01L 2924/00; H01L 51/0011; H01L 51/56; H01L 51/5012; H01L 2224/48091
See application file for complete search history.

(56) References Cited

U.S. PATENT DOCUMENTS

2010/0297349 A1 11/2010 Lee et al.
2012/0183676 A1 7/2012 Sonoda et al.
(Continued)

FOREIGN PATENT DOCUMENTS

JP 2010-270396 12/2010
WO WO-2011/034011 3/2011
(Continued)

OTHER PUBLICATIONS

International Search Report mailed Jun. 3, 2014, directed to International Application No. PCT/JP2014/055407, 2 pages.

*Primary Examiner* — Tony Tran
(74) *Attorney, Agent, or Firm* — Morrison & Foerster LLP

(57) ABSTRACT

The vapor deposition apparatus employs scanning vapor deposition, and includes a limiting component including a first plate portion; a second plate portion provided with a space from the first plate portion; and a joint portion combining the first plate portion with the second plate portion, the first plate portion being provided with an first opening, the second plate portion being provided with an second opening that faces the first opening, the vapor deposition apparatus including a first space between the first opening and the second opening, the vapor deposition apparatus including a second space between the first plate portion and the second plate portion, the first space being connected
(Continued)

to the second space, the vapor deposition apparatus including a third space that is in the outside of the limiting component, the second space being connected to the third space.

6 Claims, 19 Drawing Sheets

(51) Int. Cl.
    *C23C 14/12*     (2006.01)
    *C23C 16/458*     (2006.01)
    *H01L 51/50*     (2006.01)
    *H01L 27/32*     (2006.01)

(52) U.S. Cl.
    CPC ........ *C23C 16/458* (2013.01); *H01L 27/3241* (2013.01); *H01L 51/50* (2013.01); *H01L 51/5012* (2013.01)

(56) References Cited

U.S. PATENT DOCUMENTS

| | | |
|---|---|---|
| 2013/0059063 A1 | 3/2013 | Kawato et al. |
| 2013/0089941 A1 | 4/2013 | Sonoda et al. |
| 2013/0240870 A1 | 9/2013 | Kawato et al. |
| 2013/0323881 A1 | 12/2013 | Sonoda et al. |
| 2016/0194747 A1* | 7/2016 | Kawato .................. C23C 14/24 438/46 |

FOREIGN PATENT DOCUMENTS

| | | |
|---|---|---|
| WO | WO-2011/145456 | 11/2011 |
| WO | WO-2012/029545 | 3/2012 |
| WO | WO-2012/086453 | 6/2012 |
| WO | WO-2012/121139 | 9/2012 |

\* cited by examiner

VAPOR DEPOSITION APPARATUS, VAPOR DEPOSITION METHOD, AND METHOD FOR PRODUCING ORGANIC ELECTROLUMINESCENT ELEMENT

CROSS-REFERENCE TO RELATED APPLICATIONS

This application is a national phase application under 35 U.S.C. 371 of International Application No. PCT/JP2014/055407, filed Mar. 4, 2014, and which claims priority to Japanese Patent Application No. 2013-142888, filed Jul. 8, 2013, the contents of which are incorporated herein by reference in their entirety.

FIELD OF THE INVENTION

The present invention relates to a vapor deposition apparatus, a vapor deposition method, and a method for producing an organic electroluminescent element. More specifically, the present invention relates to a vapor deposition apparatus and a vapor deposition method, and a method for producing an organic electroluminescent element which are suitable for production of an organic EL element for large-sized substrates.

BACKGROUND OF THE INVENTION

Flat-panel displays have recently been utilized in various products and fields. These flat-panel displays have been desired to have a larger size, higher display qualities, and lower power consumption.

Organic electroluminescent display devices including organic EL elements that utilize electroluminescence (hereinafter, also abbreviated as "EL") of an organic material have drawn much attention as an all-solid-state flat-panel display with excellent properties of low voltage driving, high-speed response, and a self-luminous property.

An organic EL display device includes thin-film transistors (TFTs) and organic EL elements connected to the TFTs on a substrate such as a glass substrate.

The organic EL elements are light-emitting elements capable of providing a high-luminance light when driven by low-voltage direct current, and each have a structure in which the first electrode, an organic EL layer, and the second electrode are laminated in the stated order. The first electrodes are connected to the TFTs. The organic EL layers each have a structure in which organic layers such as a hole injection layer, a hole transport layer, an electron blocking layer, a light-emitting layer, a hole blocking layer, an electron transport layer, and an electron injection layer are laminated.

A full-color organic EL display device typically includes organic EL elements in three colors of red (R), green (G), and blue (B), as the sub-pixels. The sub-pixels are aligned in a matrix on a substrate, and sub-pixels in these three colors constitute each pixel. The display device provides images by selectively allowing the organic EL elements to emit light with the desired luminance values, using the TFTs.

In production of such an organic EL display device, patterned light-emitting layers corresponding to sub-pixels are formed from organic light-emitting materials.

One method for forming the light-emitting layer by patterning having been developed recently utilizes a mask smaller than the substrate to carry out vapor deposition on the entire substrate while moving the substrate relative to the mask and the vapor deposition source, so that organic EL elements are formed on the substrate that is larger than the mask (e.g. Patent Literatures 1 to 5). Hereinafter, such a method for carrying out vapor deposition while moving (scanning) the substrate relative to the mask and the vapor deposition source is also referred to as scanning vapor deposition.

Patent Literature

Patent Literature 1: JP 2010-270396 A
Patent Literature 2: WO 2011/034011
Patent Literature 3: WO 2011/145456
Patent Literature 4: WO 2012/029545
Patent Literature 5: WO 2012/121139

SUMMARY OF THE INVENTION

In scanning vapor deposition, the substrate is spaced from the mask to prevent the substrate from being damaged upon coming into contact with the mask while being scanned. This arrangement tends to blur the outlines of a patterned thin film to be formed on the substrate. That is, this arrangement tends to produce, at each side of a portion with a uniform film thickness, a portion with a gradually decreasing film thickness.

For scanning vapor deposition, a technique used is controlling vapor deposition streams ejected from nozzles of a vapor deposition source using a limiting plate, which is a plate-like component arranged above the vapor deposition source, so as to control vapor deposition particles from other nozzles than the desired nozzles to not to travel to the openings of the mask.

However, when the density of vapor deposition particles in the vapor deposition streams is increased by factors such as a raise in the vapor deposition rate or a state where the nozzles are close to the limiting plate, the above technique may not be able to control the vapor deposition streams perfectly, thereby failing to control vapor deposition particles from the undesired nozzles not to travel to the openings of the mask. In this case, the resulting thin film contains the vapor deposition particles from the undesired nozzles. As a result, unexpected blurs of the outlines of the resulting patterned thin film may occur. That is, the patterned thin film may have a larger width than the designed width. Also, the transferred patterns may include an unusual (unnecessary) pattern called a ghost as well as the normal patterns. These phenomena are concerned to cause, for example in organic EL display devices providing RGB full color display, abnormal light emission such as mixed-color light emission. Abnormal light emission significantly spoils the display qualities of an organic EL display device. As described above, an increase in the density of vapor deposition particles in the vapor deposition streams may cause a decline in the function of the limiting plate.

This decline is considered to be caused as described below. In the state where the vapor deposition particles are highly dense, there is a high probability that the vapor deposition particles collide with each other, leading to high dispersion of the vapor deposition particles. Also, since a limiting plate is usually placed near the vapor deposition source, the portions of the vapor deposition streams passing through the limiting plate are relatively highly dense. This means that a high density of vapor deposition particles in the vapor deposition streams increases the probability of collision or dispersion of vapor deposition particles when the vapor deposition streams pass through the limiting plate. Also, vapor deposition particles having failed to pass through the limiting plate and adhered to the limiting plate, e.g., the side face of an opening of the limiting plate, may re-evaporate upon the temperature increase in the limiting plate. The re-evaporated vapor deposition particles are not controlled unlike the vapor deposition particles from the nozzles immediately after the ejection, and the particles may travel in unexpected directions. These phenomena are considered to unnecessarily widen the vapor deposition streams which should be controlled by the limiting plate, after the vapor deposition streams pass through the limiting plate. As a result, some of the streams probably reach a region in which a film is to be formed by the neighboring vapor deposition streams, producing unexpected blurs and/or ghosts.

For example, the thin-film vapor deposition apparatus described in Patent Literature 1 has nothing between the barrier wall designed to function as a limiting plate and the second nozzle designed to function as a mask. Hence, raising the vapor deposition rate would cause unexpected blurs and/or ghosts similarly to the above case.

The present invention was made in view of the above state of the art, and aims to provide a vapor deposition apparatus and a vapor deposition method which can form a patterned thin film with high precision.

The present invention made in view of the above state of the art also aims to provide a method for producing an organic electroluminescent display device with excellent display qualities.

One aspect of the present invention may be a vapor deposition apparatus for forming a patterned thin film on a substrate, the apparatus including:

a vapor deposition unit including a vapor deposition source, a limiting component, and a mask; and a moving system configured to move one of the substrate and the vapor deposition unit relative to the other of the substrate and the vapor deposition unit in a first direction orthogonal to the normal direction of the substrate, with the substrate being spaced from the mask, the vapor deposition source, the limiting component, the mask, and the substrate being arranged in the stated order, the limiting component including:

a first plate portion;

a second plate portion provided with a space from the first plate portion; and a joint portion combining the first plate portion with the second plate portion, the first plate portion being provided with an opening, the second plate portion being provided with an opening that faces the opening of the first plate portion, the vapor deposition apparatus including a first space between the opening of the first plate portion and the opening of the second plate portion, the vapor deposition apparatus including a second space between the first plate portion and the second plate portion, the second space being adjacent to the first space in a second direction that is perpendicular to the normal direction of the substrate and to the first direction, the first space being connected to the second space, the vapor deposition apparatus including a third space that is adjacent to the second space in the first direction and is in the outside of the limiting component, the second space being connected to the third space.

Hereinafter, the vapor deposition apparatus is also referred to as the vapor deposition apparatus of the present invention.

Preferred modes of the vapor deposition apparatus of the present invention are described below. The following preferred modes may appropriately be combined with each other. A combination of two or more of the following preferred modes is also one preferred mode.

It may be possible that there are a plurality of the joint portions, the limiting component includes, as the joint portions, a first wall and a second wall each provided with an opening, the first wall is provided between the first space and the second space, the second wall is provided between the second space and the third space, the first space is connected to the second space via the opening of the first wall, and the second space is connected to the third space via the opening of the second wall.

It may be possible that there are a plurality of the openings of the first wall, and there are a plurality of the openings of the second wall.

It may be possible that the second plate portion is provided with a second opening, and the second opening of the second plate portion faces a region of the first plate portion other than the opening of the first plate portion.

It may be possible that the first plate portion is provided with a second opening, the second opening of the first plate portion faces a region of the second plate portion other than the opening of the second plate portion, the vapor deposition apparatus further comprises a plate placed with a space from the first plate portion between the first plate portion and the mask, and the plate is larger than the second opening of the first plate portion, and contains the whole second opening in a view in the normal direction of the substrate.

It may be possible that the limiting component further includes a joint portion that combines the plate with the first plate portion.

Another aspect of the present invention may be a vapor deposition method including a vapor deposition step of forming a patterned thin film on a substrate, the vapor deposition step being performed with the vapor deposition apparatus of the present invention.

Yet another aspect of the present invention may be a method for producing an organic electroluminescent element, including a vapor deposition step of forming a patterned thin film with the vapor deposition apparatus of the present invention.

The present invention can provide a vapor deposition apparatus and a vapor deposition method that can form a patterned thin film with high precision.

Also, the present invention can provide a method for producing an organic electroluminescent display device with excellent display qualities.

DETAILED DESCRIPTION OF THE INVENTION

Hereinafter, the present invention will be described in more detail with reference to the drawings based on embodiments which, however, are not intended to limit the scope of the present invention.

The following embodiments appropriately employ, for description, a Cartesian coordinate system in which the X axis and the Y axis exist in the horizontal plane and the Z axis extends in the vertical direction. In the following Embodiments 1 to 6, the X-axis direction, the Y-axis direction, and the Z-axis direction respectively correspond to the second direction, the first direction, and the normal direction of the substrate in the vapor deposition apparatus of the present invention.

In the present embodiment, the method for producing organic EL elements for bottom-emission type devices in which light is emitted from the TFT substrate side and which provide RGB full-color display, and an organic EL display device including organic EL elements produced by the production method are mainly described. The present embodiment, however, is also applicable to methods for producing organic EL elements of the other types.

First, the structure of the entire organic EL display device of the present embodiment is described.

Figure 1:
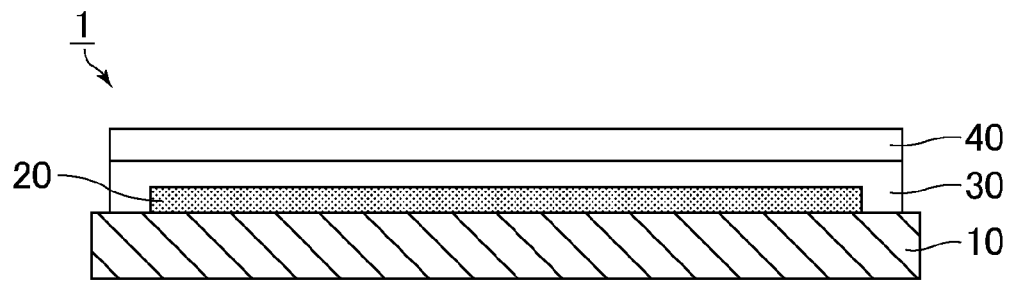
FIG. 1 is a schematic cross-sectional view of an organic EL display device including organic EL elements produced by the method for producing organic EL elements in Embodiment 1.
Figure 2:
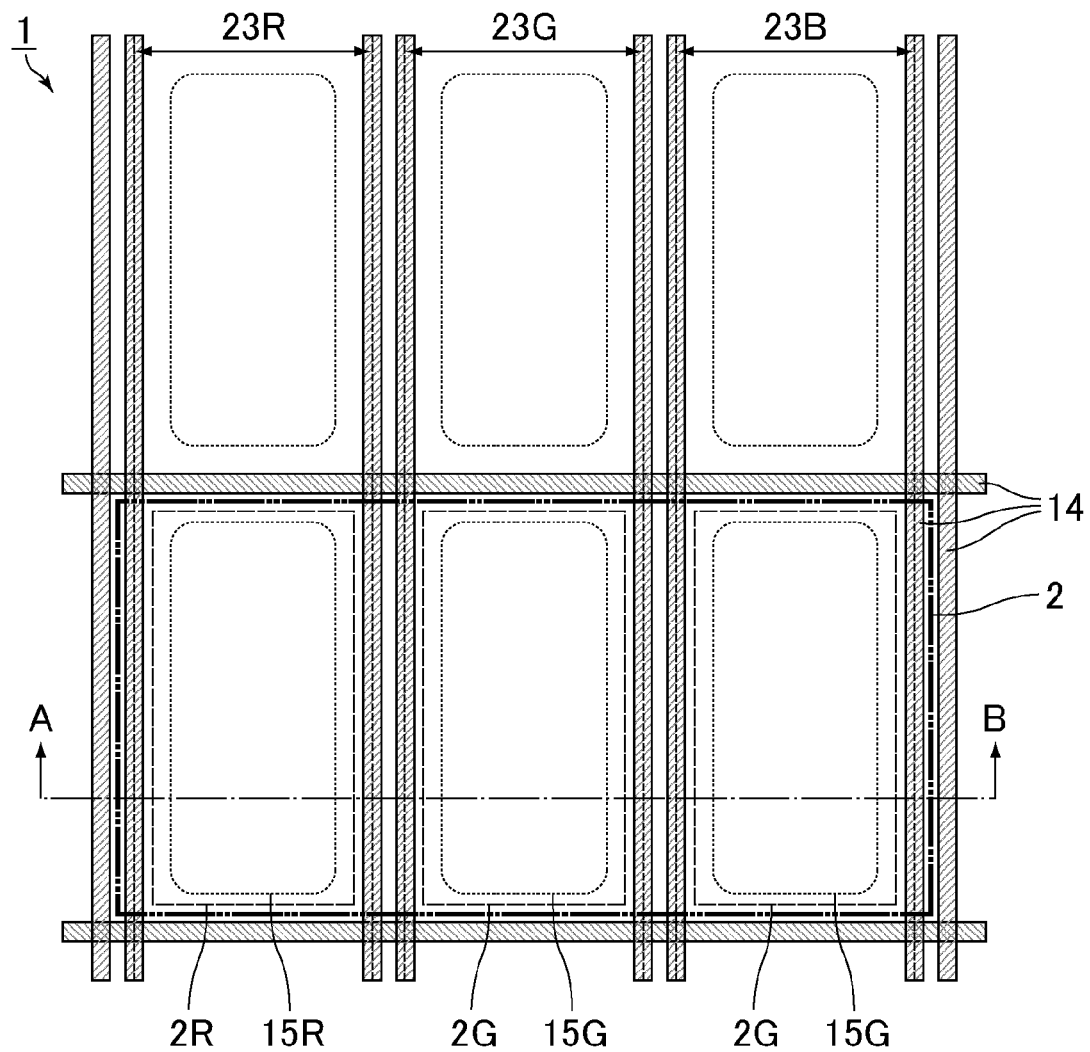
FIG. 2 is a schematic plan view of the structure in the display region of the organic EL display device illustrated in FIG. 1.
Figure 3:
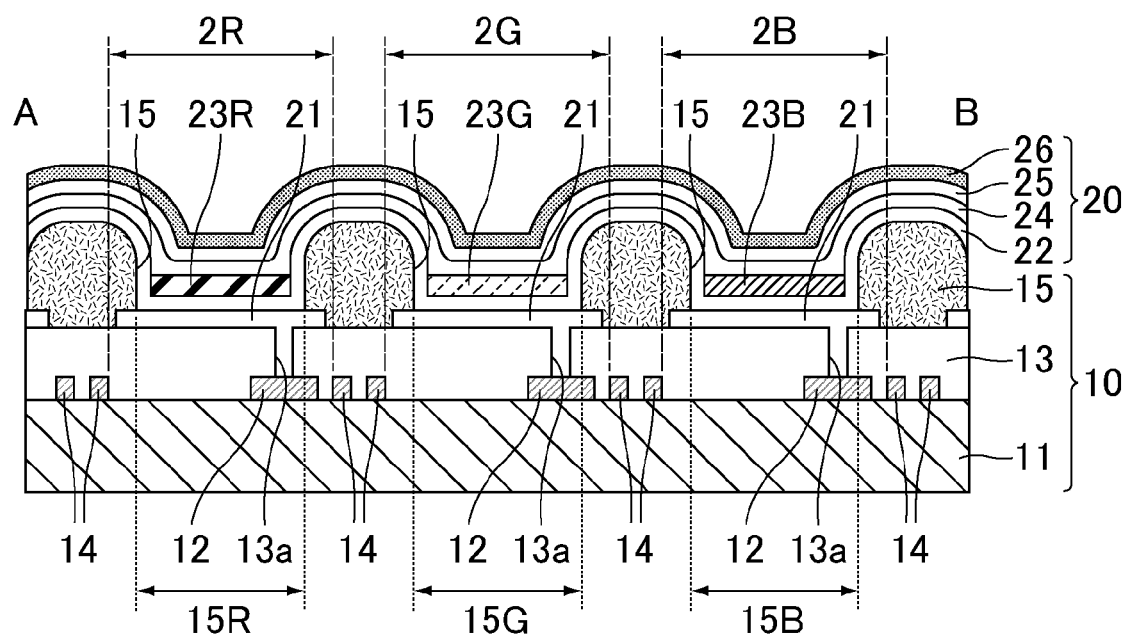
FIG. 3 is a schematic cross-sectional view of the structure of a TFT substrate in the organic EL display device illustrated in FIG. 1, and corresponds to the cross section taken along the A-B line in FIG. 2.

FIG. 1 is a schematic cross-sectional view of an organic EL display device including organic EL elements produced by the method for producing organic EL elements in Embodiment 1. FIG. 2 is a schematic plan view of the structure in the display region of the organic EL display device illustrated in FIG. 1. FIG. 3 is a schematic cross-sectional view of the structure of a TFT substrate in the organic EL display device illustrated in FIG. 1, and corresponds to the cross section taken along the A-B line in FIG. 2.

As illustrated in FIG. 1, an organic EL display device 1 of Embodiment 1 is provided with a TFT substrate 10 with TFTs 12 (cf. FIG. 3) formed thereon, organic EL elements 20 formed on the TFT substrate 10 and connected to the TFTs 12, an adhesive layer 30 covering the organic EL elements 20, and a sealing substrate 40 arranged on the adhesive layer 30.

When the sealing substrate 40 and the TFT substrate 10 with the organic EL elements 20 laminated thereon are attached by the adhesive layer 30, the organic EL elements 20 are sealed between the substrates 10 and 40 constituting one pair. Thereby, oxygen and moisture in the outside air are prevented from entering the organic EL elements 20.

As illustrated in FIG. 3, the TFT substrate 10 is provided with a transparent insulating substrate 11 such as a glass substrate as a supporting substrate. As illustrated in FIG. 2, conductive lines 14 are formed on the insulating substrate 11. The conductive lines 14 include gate lines provided in the horizontal direction, and signal lines that are provided in the vertical direction and intersect the gate lines. The gate lines are connected to a gate line driving circuit (not illustrated) which drives the gate lines. The signal lines are connected to a signal line driving circuit (not illustrated) which drives the signal lines.

The organic EL display device 1 is an active-matrix display device providing RGB full-color display, and each region defined by the conductive lines 14 includes a sub-pixel (dot) 2R, 2G, or 2B in a color red (R), green (G), or blue (B). The sub-pixels 2R, 2G, and 2B are arranged in a matrix. In each of the sub-pixels 2R, 2G, and 2B in the respective colors, an organic EL element 20 of the corresponding color and a light-emitting region are formed.

The red, green, and blue sub-pixels 2R, 2G, and 2B respectively emit red light, green light, and blue light, and each group of the three sub-pixels 2R, 2G, and 2B constitutes one pixel 2.

The sub-pixels 2R, 2G, and 2B are respectively provided with openings 15R, 15G, and 15B, and the openings 15R, 15G, and 15B are covered with red, green, and blue light-emitting layers 23R, 23G, and 23B, respectively. The light-emitting layers 23R, 23G, and 23B form stripes in the vertical direction. The patterned light-emitting layers 23R, 23G, and 23B are formed separately for one color at one time by vapor deposition. The openings 15R, 15G, and 15B are described later.

Each of the sub-pixels 2R, 2G, and 2B is provided with a TFT 12 connected to a first electrode 21 of the organic EL element 20. The luminescence intensity of each of the sub-pixels 2R, 2G, and 2B is determined based on scanning and selection using the conductive lines 14 and the TFTs 12. As described above, the organic EL display device 1 provides image display by selectively allowing the organic EL elements 20 in the individual colors to emit light, using the TFTs 12.

Next, the structures of the TFT substrate 10 and the organic EL elements 20 are described in detail. First, the TFT substrate 10 is described.

As illustrated in FIG. 3, the TFT substrate 10 is provided with the TFTs 12 (switching elements) and the conductive lines 14 which are formed on the insulating substrate 11; an interlayer film (interlayer insulating film, flattening film) 13 that covers the TFTs and conductive lines; and an edge cover 15 which is an insulating layer formed on the interlayer film 13.

The TFTs 12 are formed for the respective sub-pixels 2R, 2G, and 2B. Here, since the structure of the TFTs 12 may be a common structure, layers in the TFTs 12 are not illustrated or described.

The interlayer film 13 is formed on the insulating substrate 11 to cover the entire region of the insulating substrate 11. On the interlayer film 13, the first electrodes 21 of the organic EL elements 20 are formed. Also, the interlayer film 13 is provided with contact holes 13a for electrically connecting the first electrodes 21 to the TFTs 12. In this manner, the TFTs 12 are electrically connected to the organic EL elements 20 via the contact holes 13a.

The edge cover 15 is formed to prevent a short circuit between the first electrode 21 and a second electrode 26 of each organic EL element 20 when the organic EL layer is thin or concentration of electric fields occurs at the end of the first electrode 21. The edge cover 15 is therefore formed to partly cover the ends of the first electrodes 21.

The above-mentioned openings 15R, 15G, and 15B are formed in the edge cover 15. These openings 15R, 15G, and 15B of the edge cover 15 respectively serve as light-emitting regions of the sub-pixels 2R, 2G, and 2B. In other words, the sub-pixels 2R, 2G, and 2B are separated by the edge cover 15 which has insulation properties. The edge cover 15 functions also as an element-separation film.

Next, the organic EL element 20 is described.

The organic EL elements 20 are light-emitting elements capable of providing a high-luminance light when driven by low-voltage direct current, and each include the first electrode 21, the organic EL layer, and the second electrode 26 which are laminated in the stated order.

The first electrode 21 is a layer having a function of injecting (supplying) holes into the organic EL layer. The first electrode 21 is connected to the TFT 12 via the contact hole 13a as described above.

As illustrated in FIG. 3, the organic EL layer between the first electrode 21 and the second electrode 26 includes a hole injection/hole transport layer 22, the light-emitting layer 23R, 23G, or 23B, an electron transport layer 24, and an electron injection layer 25 in the stated order from the first electrode 21 side.

The above lamination order is for the case that the first electrode 21 is an anode and the second electrode 26 is a cathode. In the case that the first electrode 21 is a cathode and the second electrode 26 is an anode, the lamination order for the organic EL layer is reversed.

The hole injection layer has a function of increasing the hole injection efficiency to the light-emitting layer 23R, 23G, or 23B. The hole transport layer has a function of increasing the hole transport efficiency to the light-emitting layer 23R, 23G, or 23B. The hole injection/hole transport layer 22 is uniformly formed on the entire display region of the TFT substrate 10 to cover the first electrodes 21 and the edge cover 15.

The present embodiment is described based on an example in which an integrated form of a hole injection layer and a hole transport layer, namely the hole injection/hole transport layer 22, is provided as the hole injection layer and the hole transport layer. The present embodiment, however, is not particularly limited to this example. The hole injection layer and the hole transport layer may be formed as layers independent of each other.

On the hole injection/hole transport layer 22, the light-emitting layers 23R, 23G, and 23B are formed corresponding to, respectively, sub-pixels 2R, 2G, and 2B, to cover the openings 15R, 15G, and 15B of the edge cover 15.

Each of the light-emitting layers 23R, 23G, and 23B has a function of emitting light by recombining holes injected from the first electrode 21 side and electrons injected from the second electrode 26 side. Each of the light-emitting layers 23R, 23G, and 23B is formed from a material exhibiting a high light-emitting efficiency, such as a low-molecular fluorescent dye and a metal complex.

The electron transport layer 24 has a function of increasing the electron transport efficiency from the second electrode 26 to each of the light-emitting layers 23R, 23G, and 23B. The electron injection layer 25 has a function of increasing the electron injection efficiency from the second electrode 26 to each of the light-emitting layers 23R, 23G, and 23B.

The electron transport layer 24 is uniformly formed on the entire display region of the TFT substrate 10 to cover the light-emitting layers 23R, 23G, and 23B, and the hole injection/hole transport layer 22. Also, the electron injection layer 25 is uniformly formed on the entire display region of the TFT substrate 10 to cover the electron transport layer 24.

The electron transport layer 24 and the electron injection layer 25 may be formed as layers independent of each other, or may be formed as an integrated layer. That is, the organic EL display device 1 may be provided with an electron transport/electron injection layer in place of the electron transport layer 24 and the electron injection layer 25.

The second electrode 26 has a function of injecting electrons to the organic EL layer. The second electrode 26 is uniformly formed on the entire display region of the TFT substrate 10 to cover the electron injection layer 25.

Here, organic layers other than the light-emitting layers 23R, 23G, and 23B are not essential layers for the organic EL layer, and may be appropriately formed depending on the required properties of the organic EL elements 20. The organic EL layer may additionally include a carrier blocking layer. For example, a hole blocking layer may be added as a carrier blocking layer between the light-emitting layer 23R, 23G, or 23B and the electron transport layer 24 such that holes can be prevented from reaching the electron transport layer 24, and thereby the light-emitting efficiency is enhanced.

The structure of the organic EL elements 20 may be any of the following structures (1) to (8).

(1) First electrode/light-emitting layer/second electrode (2) First electrode/hole transport layer/light-emitting layer/electron transport layer/second electrode (3) First electrode/hole transport layer/light-emitting layer/hole blocking layer/electron transport layer/second electrode (4) First electrode/hole transport layer/light-emitting layer/hole blocking layer/electron transport layer/electron injection layer/second electrode (5) First electrode/hole injection layer/hole transport layer/light-emitting layer/electron transport layer/electron injection layer/second electrode (6) First electrode/hole injection layer/hole transport layer/light-emitting layer/hole blocking layer/electron transport layer/second electrode (7) First electrode/hole injection layer/hole transport layer/light-emitting layer/hole blocking layer/electron transport layer/electron injection layer/second electrode (8) First electrode/hole injection layer/hole transport layer/electron blocking layer (carrier blocking layer)/light-emitting layer/hole blocking layer/electron transport layer/electron injection layer/second electrode The hole injection layer and the hole transport layer may be integrated as described above. Also, the electron transport layer and the electron injection layer may be integrated.

The structure of the organic EL elements 20 is not limited to the structures (1) to (8), and any desired layer structure can be used depending on the required properties of the organic EL elements 20.

Next, the method for producing the organic EL display device 1 is described.

Figure 4:
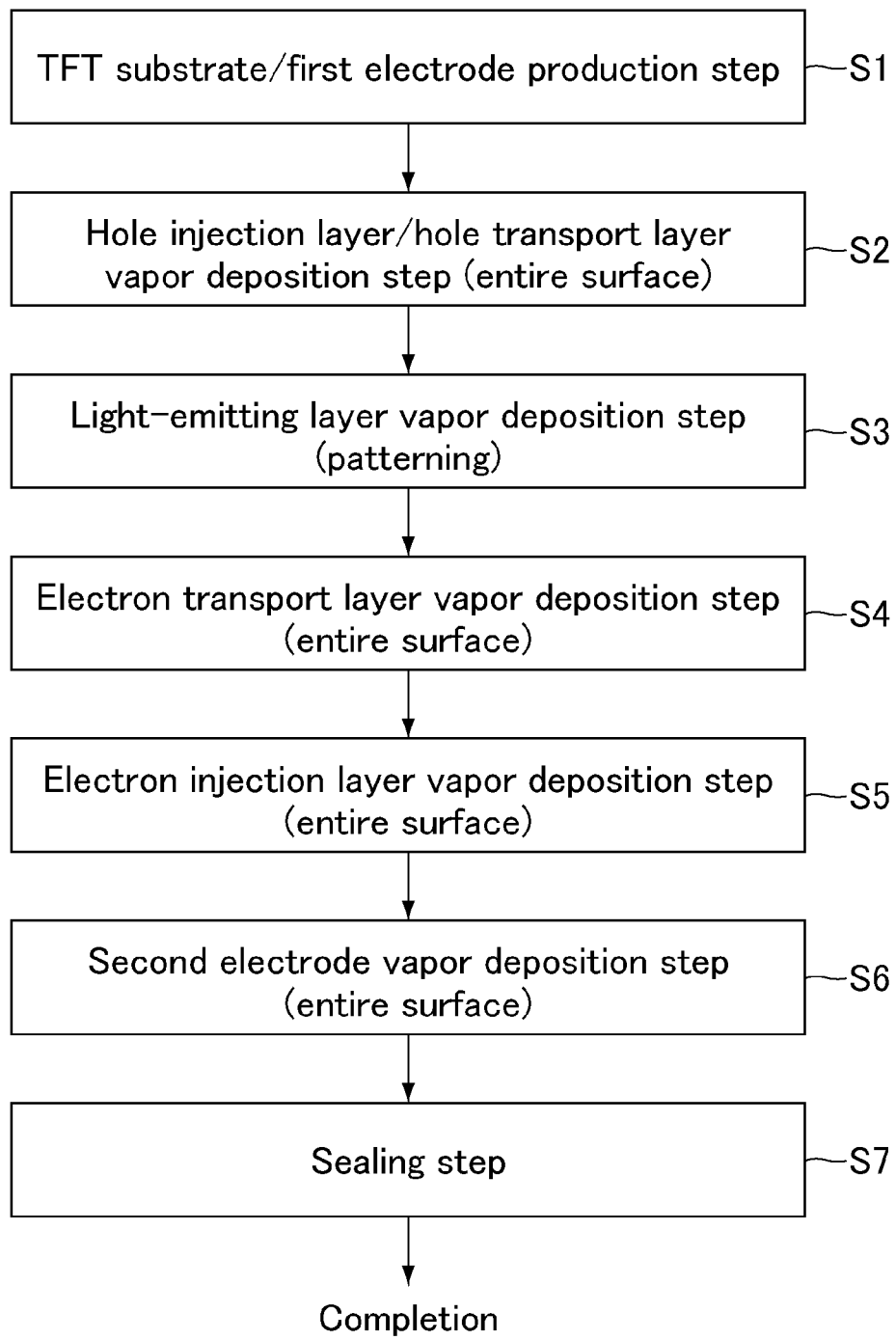
FIG. 4 is a flowchart for describing the production steps of the organic EL display device of Embodiment 1.

FIG. 4 is a flowchart for describing the production steps of the organic EL display device of Embodiment 1.

As illustrated in FIG. 4, the method for producing an organic EL display device according to the present embodiment includes, for example, a TFT substrate/first electrode production step S1, a hole injection layer/hole transport layer vapor deposition step S2, a light-emitting layer vapor deposition step S3, an electron transport layer vapor deposition step S4, an electron injection layer vapor deposition step S5, a second electrode vapor deposition step S6, and a sealing step S7.

Hereinafter, the production steps of the components described above with reference to FIGS. 1 to 3 are described by following the flowchart shown in FIG. 4. The size, material, shape, and the other designs of each component described in the present embodiment are merely examples which are not intended to limit the scope of the present invention.

As described above, the lamination order described in the present embodiment is for the case that the first electrode 21 is an anode and the second electrode 26 is a cathode. In the case that the first electrode 21 is a cathode and the second electrode 26 is an anode, the lamination order for the organic EL layer is reversed. Similarly, the materials of the first electrode 21 and the second electrode 26 are changed to the corresponding materials.

First, as illustrated in FIG. 3, a photosensitive resin is applied by a common method to the insulating substrate 11 on which components such as the TFTs 12 and the conductive lines 14 are formed, and the photosensitive resin is patterned by photolithography, so that an interlayer film 13 is formed on the insulating substrate 11.

The insulating substrate 11 may be, for example, a glass substrate or a plastic substrate with a thickness of 0.7 to 1.1 mm, a Y-axial direction length (vertical length) of 400 to 500 mm, and an X-axis direction length (horizontal length) of 300 to 400 mm.

The material of the interlayer film 13 can be, for example, a resin such as an acrylic resin and a polyimide resin. Examples of the acrylic resin include the OPTMER series from JSR Corporation. Examples of the polyimide resin include the PHOTONEECE series from Toray Industries, Inc. The polyimide resin, however, is typically colored, not transparent. For this reason, in the case of producing a bottom-emission organic EL display device as the organic EL display device 1 as illustrated in FIG. 3, a transparent resin such as an acrylic resin is more suitable for the interlayer film 13.

The thickness of the interlayer film 13 may be any value that can compensate for the steps formed by the TFTs 12. For example, the thickness may be about 2 μm.

Next, the contact holes 13a for electrically connecting the first electrodes 21 to the TFTs 12 are formed in the interlayer film 13.

A conductive film (electrode film), for example an indium tin oxide (ITO) film, is formed to a thickness of 100 nm by sputtering or the like method.

A photoresist is applied to the ITO film, and the photoresist is patterned by photolithography. Then, the ITO film is etched with ferric chloride as an etching solution. The photoresist is removed by a resist removing solution, and the substrate is washed. Thereby, the first electrodes 21 are formed in a matrix on the interlayer film 13.

The conductive film material used for the first electrodes 21 may be, for example, a transparent conductive material such as ITO, indium zinc oxide (IZO), and gallium-added zinc oxide (GZO); or a metal material such as gold (Au), nickel (Ni), and platinum (Pt).

The lamination method for the conductive film other than sputtering may be vacuum vapor deposition, chemical vapor deposition (CVD), plasma CVD, or printing.

The thickness of each first electrode 21 is not particularly limited, and may be 100 nm as described above, for example.

The edge cover 15 is then formed to a thickness of about 1 μm, for example, by the same method as that for the interlayer film 13. The material of the edge cover 15 can be the same insulating material as that for the interlayer film 13.

By the above procedure, the TFT substrate 10 and the first electrodes 21 are produced (S1).

Next, the TFT substrate 10 obtained in the above step is subjected to the reduced-pressure baking for dehydration, and to oxygen plasma treatment for surface washing of the first electrodes 21.

With a typical vapor deposition apparatus, a hole injection layer and a hole transport layer (hole injection/hole transport layer 22 in the present embodiment) are deposited on the entire display region of the TFT substrate 10 (S2).

Specifically, an open mask which is open to the entire display region is subjected to alignment control relative to the TFT substrate 10, and the open mask is attached closely to the TFT substrate 10. The vapor deposition particles dispersed from the vapor deposition source are then evenly deposited on the entire display region via the opening of the open mask, while both the TFT substrate 10 and the open mask are rotated.

Here, the vapor deposition to the entire display region means continuous vapor deposition over sub-pixels which are in different colors from the adjacent sub-pixels.

Examples of the material for the hole injection layer and the hole transport layer include benzine, styrylamine, triphenylamine, porphyrin, triazole, imidazole, oxadiazole, polyarylalkane, phenylenediamine, arylamine, oxazole, anthracene, fluorenone, hydrazone, stilbene, triphenylene, azatriphenylene, and derivatives thereof; polysilane-based compounds; vinylcarbazole-based compounds; and conjugated heterocyclic monomers, oligomers, or polymers, such as thiophene-based compounds and aniline-based compounds.

The hole injection layer and the hole transport layer may be integrated as described above, or may be formed as layers independent of each other. The thickness of each layer is, for example, 10 to 100 nm.

In the case of forming the hole injection/hole transport layer 22 as the hole injection layer and the hole transport layer, the material of the hole injection/hole transport layer 22 may be, for example, 4,4'-bis[N-(1-naphthyl)-N-phenylamino]biphenyl (α-NPD). The thickness of the hole injection/hole transport layer 22 may be, for example, 30 nm.

On the hole injection/hole transport layer 22, the light-emitting layers 23R, 23G, and 23B are separately formed (by patterning) to correspond to the sub-pixels 2R, 2G, and 2B, and cover the openings 15R, 15G, and 15B of the edge cover 15, respectively (S3).

As described above, a material with a high light-emitting efficiency, such as a low-molecular fluorescent dye or a metal complex, is used for each of the light-emitting layers 23R, 23G, and 23B.

Examples of the material of the light-emitting layers 23R, 23G, and 23B include anthracene, naphthalene, indene, phenanthrene, pyrene, naphthacene, triphenylene, anthracene, perylene, picene, fluoranthene, acephenanthrylene, pentaphene, pentacene, coronene, butadiene, coumarin, acridine, stilbene, and derivatives thereof; a tris(8-quinolinolato)aluminum complex; a bis(benzoquinolinolato)beryllium complex; a tri(dibenzoylmethyl)phenanthroline europium complex; and ditolylvinyl biphenyl.

The thickness of each of the light-emitting layers 23R, 23G, and 23B is 10 to 100 nm, for example.

The production method of the present invention is especially suitable for formation of such light-emitting layers 23R, 23G, and 23B.

The method for forming the patterned light-emitting layers 23R, 23G, and 23B using the production method of the present invention is described later in detail.

By the same method as that in the hole injection/hole transport layer vapor deposition step S2, the electron transport layer 24 is deposited on the entire display region of the TFT substrate 10 to cover the hole injection/hole transport layer 22 and the light-emitting layers 23R, 23G, and 23B (S4).

By the same method as that in the hole injection/hole transport layer vapor deposition step S2, the electron injection layer 25 is deposited on the entire display region of the TFT substrate 10 to cover the electron transport layer 24 (S5).

Examples of the material of the electron transport layer 24 and the electron injection layer 25 include quinoline, perylene, phenanthroline, bisstyryl, pyrazine, triazole, oxazol, oxadiazole, fluorenone, and derivatives thereof and metal complexes thereof; and lithium fluoride (LiF).

Specific examples thereof include Alq3 (tris(8-hydroxyquinoline)aluminum), anthracene, naphthalene, phenanthrene, pyrene, anthracene, perylene, butadiene, coumarin, acridine, stilbene, 1,10-phenanthroline, and derivatives thereof and metal complexes thereof; and LiF.

As described above, the electron transport layer 24 and the electron injection layer 25 may be integrated or may be formed as independent layers. The thickness of each layer is 1 to 100 nm, for example, and is preferably 10 to 100 nm. Also, the total thickness of the electron transport layer 24 and the electron injection layer 25 is 20 to 200 nm, for example.

Typically, Alq3 is used as the material of the electron transport layer 24, and LiF is used as the material of the electron injection layer 25. For example, the thickness of the electron transport layer 24 is 30 nm, and the thickness of the electron injection layer 25 is 1 nm.

By the same method as that in the hole injection/hole transport layer vapor deposition step (S2), the second electrode 26 is deposited on the entire display region of the TFT substrate 10 to cover the electron injection layer 25 (S6). As a result, the organic EL elements 20 each including the organic EL layer, the first electrode 21, and the second electrode 26 are formed on the TFT substrate 10.

For the material (electrode material) of the second electrode 26, a material such as a metal with a small work function is suitable. Examples of such an electrode material include magnesium alloys (e.g. MgAg), aluminum alloys (e.g. AlLi, AlCa, AlMg), and metal calcium. The thickness of the second electrode 26 is 50 to 100 nm, for example.

Typically, the second electrode 26 is formed from a 50-nm-thick aluminum thin film.

Subsequently, as illustrated in FIG. 1, the TFT substrate 10 with the organic EL elements 20 formed thereon and the sealing substrate 40 are attached by the adhesive layer 30, so that the organic EL elements 20 are sealed (S7).

The sealing substrate 40 is, for example, an insulating substrate (e.g. glass substrate or plastic substrate) with a thickness of 0.4 to 1.1 mm.

Here, the vertical length and the horizontal length of the sealing substrate 40 may be appropriately adjusted to suit the size of the subject organic EL display device 1. The organic EL elements 20 may be sealed using an insulating substrate of substantially the same size as that of the insulating substrate 11 of the TFT substrate 10, and these substrates may be cut according to the size of the subject organic EL display device 1.

Also, the method for sealing the organic EL elements 20 is not particularly limited to the above method, and may be any other sealing method. Examples of the other sealing method include a method of sealing the elements using an engraved glass plate used as the sealing substrate 40 by a material such as a sealing resin or a glass frit applied in a frame-like shape; and a method of filling the space between the TFT substrate 10 and the sealing substrate 40 with a resin.

Also, on the second electrode 26, a protective film (not illustrated) may be provided to prevent oxygen and moisture in the outside air from entering the organic EL elements 20.

The protective film can be formed from an insulating or conductive material. Examples of such a material include silicon nitride and silicon oxide. The thickness of the protective film is 100 to 1000 nm, for example.

These steps produce the organic EL display device 1.

In this organic EL display device 1, holes are injected by the first electrodes 21 into the organic EL layer when the TFTs 12 are turned on by signals input through the conductive lines 14. Meanwhile, electrons are injected by the second electrode 26 into the organic EL layer, and the holes and electrons are recombined in each of the light-emitting layers 23R, 23G, and 23B. The energy from the recombination of the holes and electrons excites the light-emitting materials, and when the excited materials go back to the ground state, light is emitted. Controlling the luminance of the light emitted from each of the sub-pixels 2R, 2G, and 2B enables display of a predetermined image.

Next, the light-emitting-layer vapor deposition step S3 is described.

Figure 5:
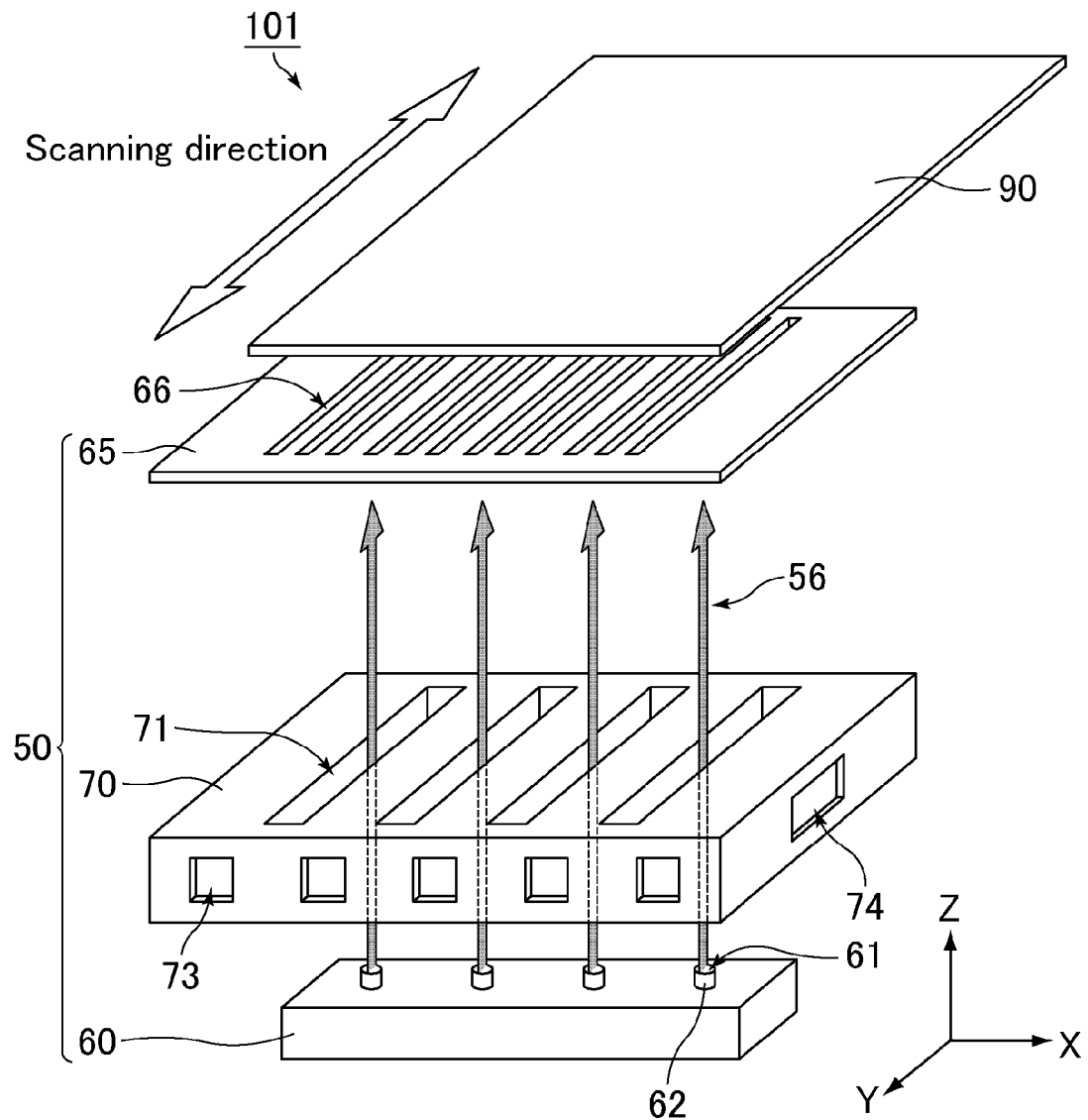
FIG. 5 is a schematic perspective view of a vapor deposition apparatus in Embodiment 1.
Figure 6:
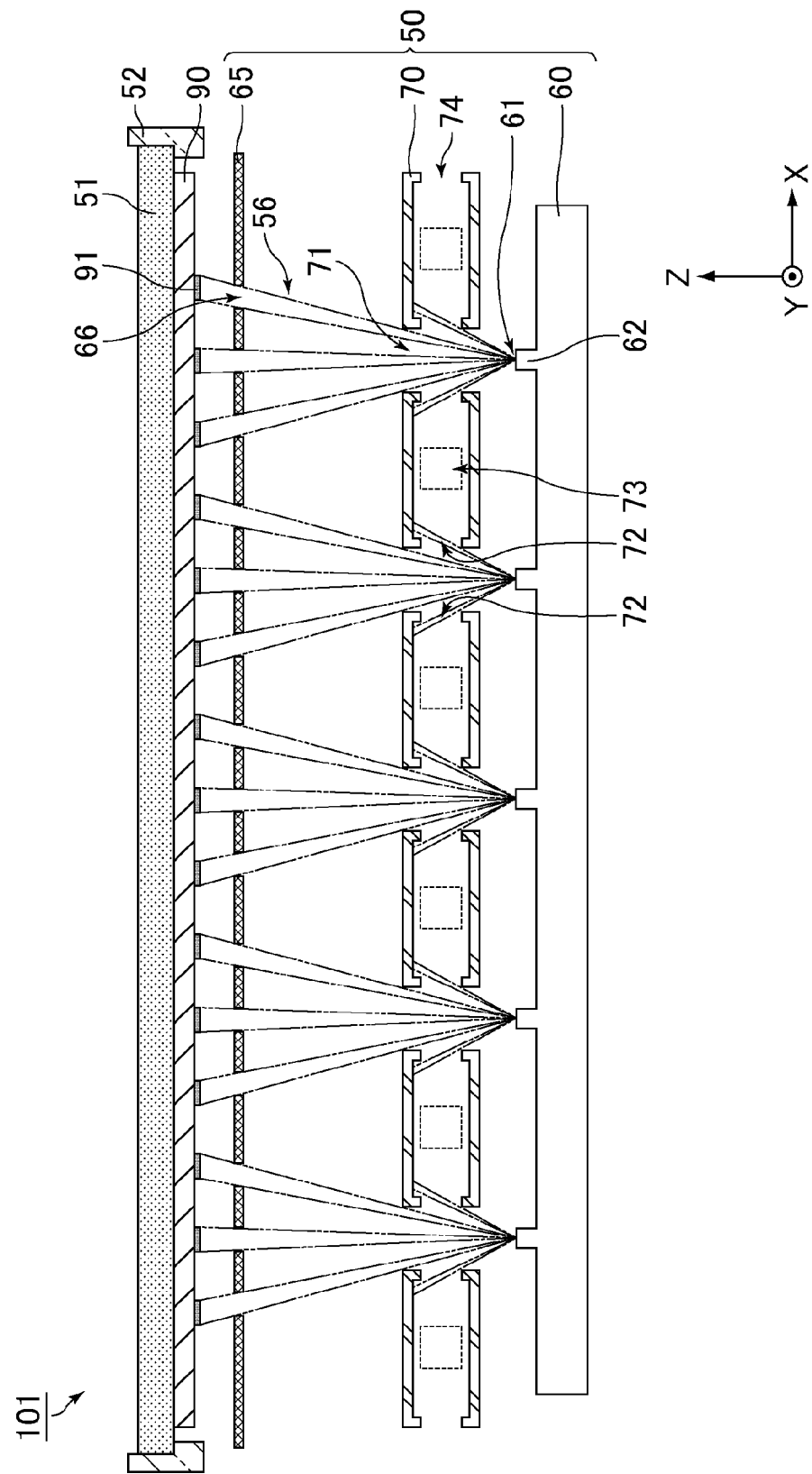
FIG. 6 is a schematic cross-sectional view of the vapor deposition apparatus in Embodiment 1, illustrating a cross section perpendicular to the scanning direction of the substrate.

FIG. 5 is a schematic perspective view of a vapor deposition apparatus in Embodiment 1. FIG. 6 is a schematic cross-sectional view of the vapor deposition apparatus in Embodiment 1, illustrating a cross section perpendicular to the scanning direction of the substrate.

As illustrated in FIG. 5 and FIG. 6, the light-emitting layer vapor deposition step S3 is performed with a vapor deposition apparatus 101 in Embodiment 1. The vapor deposition apparatus 101 is provided with a vacuum chamber (not illustrated) and a vacuum pump (not illustrated) connected to the vacuum chamber. The vapor deposition apparatus 101 is also provided with, in the vacuum chamber, a vapor deposition unit 50 including a vapor deposition source 60, a limiting component 70, and a mask (vapor deposition mask) 65; a holding system (holding tool) 51 capable of holding a substrate (film-formation target substrate) 90; a moving system (moving machine) 52 capable of moving the substrate 90 in the XY plane, i.e., in the horizontal direction; and an alignment system (alignment machine, not illustrated).

The vapor deposition source 60, the limiting component 70, and the mask 65 are integrated into one vapor deposition unit 50. The mask 65 is placed between the vapor deposition source 60 and the substrate 90, and the limiting component 70 is placed between the vapor deposition source 60 and the mask 65. In other words, the vapor deposition source 60, the limiting component 70, the mask 65, and the substrate 90 are arranged in the stated order. The vapor deposition source 60 and the limiting component 70 are spaced from each other in the Z-axis direction. The limiting component 70 and the mask 65 are spaced from each other in the Z-axis direction.

The space between the vapor deposition source 60 and the limiting component 70 is not particularly limited, and can be appropriately designed. The space between the limiting component 70 and the mask 65 is not particularly limited either, and can be appropriately designed. The space between the vapor deposition source 60 and the limiting component 70 may be about the same as the space between a vapor deposition source and a limiting plate set in conventional scanning vapor deposition. The space between the limiting component 70 and the mask 65 may be about the same as the space between a limiting plate and a mask set in conventional scanning vapor deposition.

The specific structure of the holding system 51 is not particularly limited. Specific examples thereof include an electrostatic chuck. The specific structure of the moving system 52 is not particularly limited. The moving system 52 may be, for example, a common conveyance system such as a feed screw system that rotates a screw by a motor, and a linear motor. The alignment system is configured to control the position of the substrate 90 relative to the vapor deposition unit 50, and includes, for example, a position detection device such as a CCD camera, and a control circuit connected to the position detection device.

The substrate 90 corresponds to the substrate in the vapor deposition apparatus of the present invention. The substrate 90 is a substrate produced through the TFT substrate/first electrode production step S1 and the hole injection layer/hole transport layer vapor deposition step S2, and is provided with the TFTs 12, the conductive lines 14, the interlayer film 13, the first electrodes 21, the edge cover 15, and the hole injection/hole transport layer 22 formed on the insulating substrate 11 as described above.

The vapor deposition source 60 is a container which accommodates a vapor deposition material inside, and has a heating tool (not illustrated) which heats the vapor deposition material. The portion of the vapor deposition source 60 facing the limiting component 70, that is, the upper portion, is provided with m (integer of 2 or greater) number of ejection orifices 61 periodically. The ejection orifices 61 are openings provided in the vapor deposition source 60, and are arranged collinearly in parallel with the X-axis direction. The upper limit for m is not particularly limited, and can be set appropriately. The vapor deposition material turns into vapor when heated by the heating tool, and the vapor is diffused within the vapor deposition source 60 to be ejected from the ejection orifice 61 upwardly. As a result, vapor deposition streams 56, which are streams of vapor deposition particles, are generated from the ejection orifices 61.

The planar shape of each ejection orifice 61 is not particularly limited, and can be appropriately set. Specific examples of the planar shape include a circle, an oval, a rectangle, and a square. The planar shapes of the ejection orifices 61 can be designed independently of each other, but every ejection orifice 61 is usually designed to have the same planar shape. The size (area) of each ejection orifice 61 is not particularly limited either, and can be appropriately set. The sizes (areas) of the ejection orifices 61 can be designed independently of each other, but every ejection orifice 61 is usually designed to have the same size.

As illustrated in FIG. 5 and FIG. 6, the ejection orifices 61 may be formed at the ends of the nozzles 62 on the top of the vapor deposition source 60.

The limiting component 70 is a component to remove unnecessary substances (vapor deposition particles) from the vapor deposition streams 56 ejected from the ejection orifices 61. The general structure of the limiting component 70 is that the limiting component 70 is a substantially cuboid hollow structure, and includes m number of through holes 71 corresponding to the m number of ejection orifices 61. At the sides of each through hole 71, openings 72 are provided. In the periphery portion of the limiting component 70, openings 73 and openings 74 are provided.

Hereinafter, the limiting component 70 is described in detail.

Figure 7:
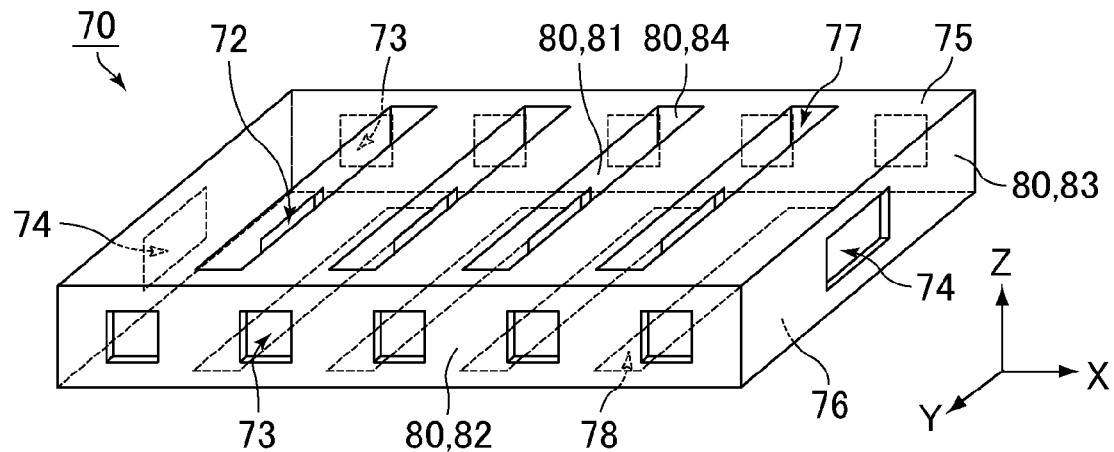
FIG. 7 is a perspective view schematically illustrating a limiting component in the vapor deposition apparatus in Embodiment 1.
Figure 8:
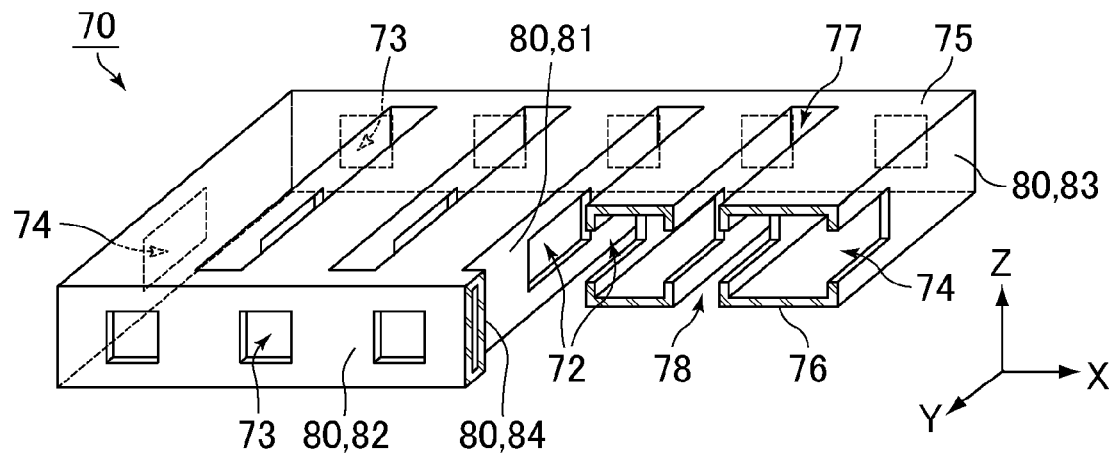
FIG. 8 is a cut-out perspective view schematically illustrating the limiting component in the vapor deposition apparatus in Embodiment 1.
Figure 9:
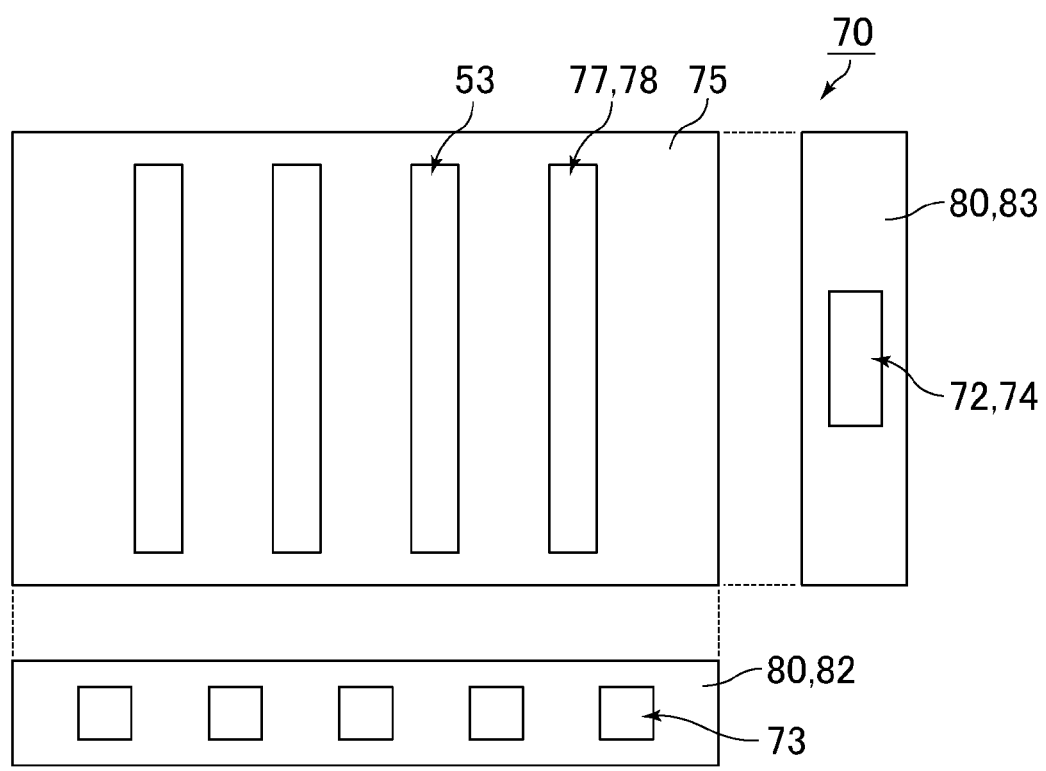
FIG. 9 shows a plan view, a front view, and a right-side view of the limiting component in the vapor deposition apparatus in Embodiment 1.
Figure 10:
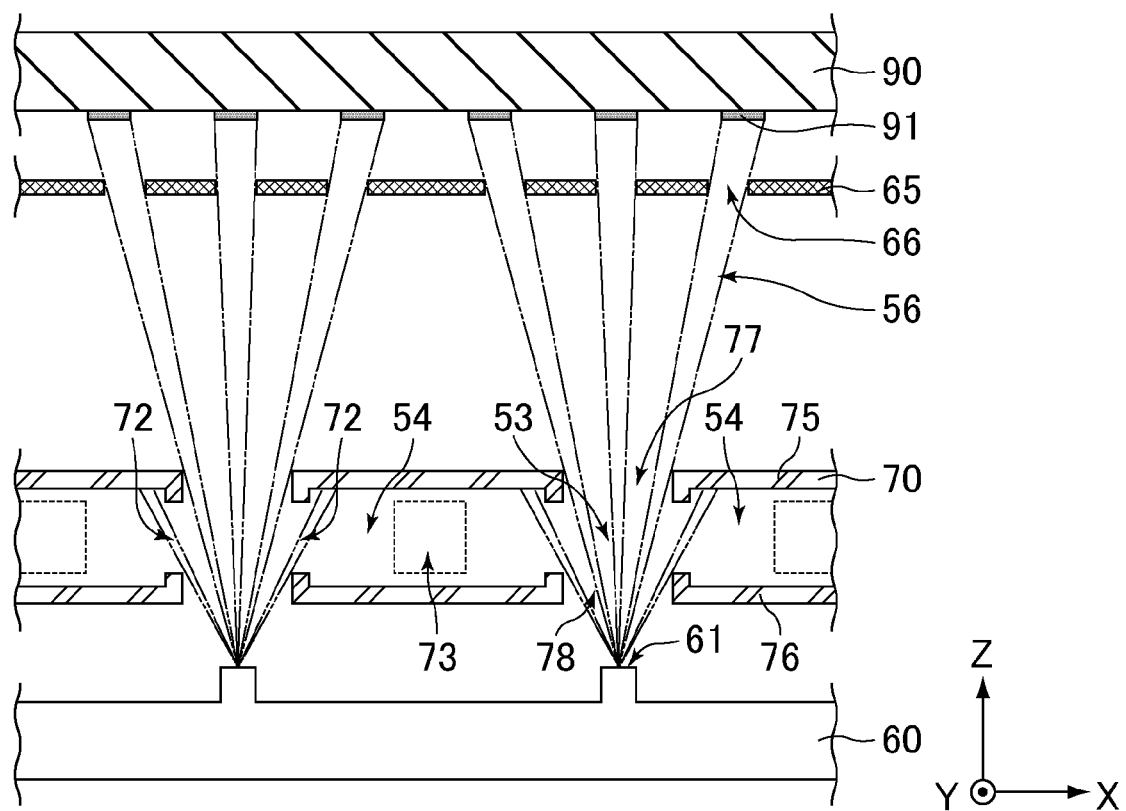
FIG. 10 is a schematic cross-sectional view of the vapor deposition apparatus in Embodiment 1, illustrating a cross section perpendicular to the scanning direction of the substrate.
Figure 11:
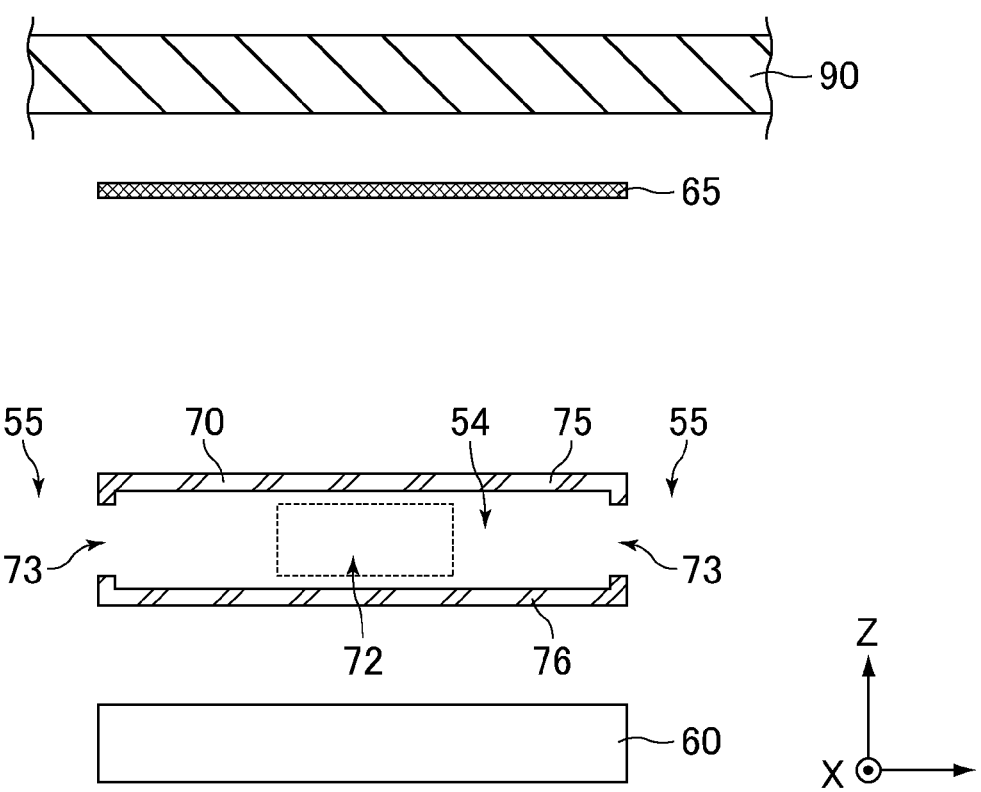
FIG. 11 is a schematic cross-sectional view of the vapor deposition apparatus in Embodiment 1, illustrating a cross section parallel to the scanning direction of the substrate.

FIG. 7 is a perspective view schematically illustrating a limiting component in the vapor deposition apparatus in Embodiment 1. FIG. 8 is a cut-out perspective view schematically illustrating the limiting component in the vapor deposition apparatus in Embodiment 1. FIG. 9 shows a plan view, a front view, and a right-side view of the limiting component in the vapor deposition apparatus in Embodiment 1. Herein, the surface of one of the two second walls is referred to as the front surface, the surface of the first plate portion is referred to as a plane surface, the surfaces of the two third walls are referred to as side surfaces, and the surface of the second plate portion is referred to as a bottom surface. FIG. 10 is a schematic cross-sectional view of the vapor deposition apparatus in Embodiment 1, illustrating a cross section perpendicular to the scanning direction of the substrate. FIG. 11 is a schematic cross-sectional view of the vapor deposition apparatus in Embodiment 1, illustrating a cross section parallel to the scanning direction of the substrate.

As illustrated in FIGS. 7 to 11, the limiting component 70 includes a first plate portion 75, a second plate portion 76, and joint portions 80. The first and second plate portions 75 and 76 are flat plate-like components provided with openings, and respectively constitute the top portion and the bottom portion of the limiting component 70. The first plate portion 75 faces the mask 65 with a space in between. The second plate portion 76 is placed between the first plate portion 75 and the vapor deposition source 60, and faces the first plate portion 75 with a space in between. The plate portions 75 and 76 are placed substantially in parallel with the XY plane. The first plate portion 75 and the second plate portion 76 are respectively provided with m number of openings 77 and m number of openings 78 at substantially the same pitch as the ejection orifices 61 in the X-axis direction. Each opening 77 faces the corresponding opening 78. That is, in a view in the Z-axis direction, at least part of each opening 77 overlaps at least part of the corresponding opening 78. Between each opening 77 and the opening 78 facing the opening 77, a first space 53 corresponding to the through hole 71 is provided.

The space between the plate portions 75 and 76 is not particularly limited, and can be appropriately set. This space may be determined based on the thickness of the thick-plate-like limiting plate used in the conventional scanning vapor deposition.

Between the plate portions 75 and 76, second spaces 54 that are adjacent to the first spaces 53 in the X-axis direction are provided. The first spaces 53 and the second spaces 54 are present alternately in the X-axis direction. In the outside of the limiting component 70, two third spaces 55 each being adjacent to the limiting component 70 in the Y-axis direction are provided. The third spaces 55 are adjacent to the second spaces 54 in the Y-axis direction. Each second space 54 is present between the two third spaces 55.

All the openings 77 and 78 are in substantially the same planar shape with substantially the same size, and the planar shape of each of the openings 77 and 78 is a rectangle or a square. Each opening 77 is formed at substantially the same position as the corresponding opening 78 in a view in the Z-axis direction. The outline of each opening 77 substantially conforms to the outline of the corresponding opening 78 in a view in the Z-axis direction.

Each opening 77 may be formed at a different position from the corresponding opening 78 in a view in the Z-axis direction. Also, the outline of each opening 77 may be positioned off the outline of the corresponding opening 78 in a view in the Z-axis direction.

The planar shape of each of the openings 77 and 78 is not particularly limited to a rectangle or a square, and the planar shapes of the openings 77 and 78 can be appropriately set independently of each other. The planar shape of each of the openings 77 and 78 usually includes two sides that are parallel to each other, and the two sides are usually parallel to the Y-axis direction.

Also, the sizes of the openings 77 and 78 are not particularly limited, and can be appropriately set independently of each other. For example, all the openings 77 may be formed into substantially the same shape with substantially the same size, and all the openings 78 may be formed into substantially the same shape, which is different from the shape of the openings 77, with substantially the same size. The sizes of the openings 77 and 78 may be about the same as the sizes of the openings provided in a limiting plate used in the conventional scanning vapor deposition.

The first plate portion 75 is joined with the second plate portion 76 by the joint portions 80, and the first plate portion 75 is integrated with the second plate portion 76. The limiting component 70 includes, as the joint portions 80, (2×m) number of the first walls 81, two second walls 82 facing each other, two third walls 83 facing each other, and (2×m) number of fourth walls 84. Each of the first walls 81 is a flat-plate-like component provided with one opening 72. Each of the second walls 82 is a flat-plate-like component provided with (m+1) number of openings 73. Each of the third walls 83 is a flat-plate-like component provided with one opening 74. Each of the fourth walls 84 is a flat-plate-like component provided with no opening. The second walls 82 and the third walls 83 constitute the outer periphery of the limiting component 70, and two of the first walls 81 facing each other and two of the fourth walls 84 in contact therewith constitute one through hole 71.

Each opening 72 faces the opening 72 of the opposite first wall 81 via the first space 53. That is, in a view in the X-axis direction, at least part of each opening 72 overlaps at least part of the opening 72 of the opposite first wall 81. Each opening 72 is formed at the side of the first space 53 in the X-axis direction.

All the openings 72 and 74 are formed to have substantially the same planar shape with substantially the same size, and the planar shape of each opening 72 or 74 is a rectangle or a square. All the openings 72 and 74 are formed at substantially the same position in a view in the X-axis direction, and the outlines of all the openings 72 and 74 substantially conform to each other in a view in the X-axis direction.

Here, each opening 72 may be formed at a position different from the position of the opening 72 of the opposite first wall 81 in a view in the X-axis direction, and the outline of each opening 72 may be positioned off the outline of the opening 72 of the opposite first wall 81 in a view in the X-axis direction.

Each opening 73 faces the opening 73 of the opposite second wall 82 via the second space 54. That is, in a view in the Y-axis direction, at least part of each opening 73 overlaps at least part of the opening 73 of the opposite second wall 82. Each opening 73 is formed at the side of the second space 54 in the Y-axis direction.

All the openings 73 are formed to have substantially the same planar shape with substantially the same size, and the planar shape of each opening 73 is a rectangle or a square. Each opening 73 is formed at substantially the same position as the opening 73 of the opposite second wall 82 in a view in the Y-axis direction, and the outline of each opening 73 substantially conforms to the outline of the opening 73 of the opposite second wall 82 in a view in the Y-axis direction.

Here, the planar shape of each opening 72, 73, or 74 is not particularly limited to a rectangle or a square. The planar shapes of the openings 72 and 74 can be appropriately set independently of each other. The planar shapes of the openings 73 can be appropriately set independently of each other. The sizes of the openings 72, 73, and 74 are not particularly limited, and can be appropriately set independently of each other. The sizes of the openings 72, 73, and 74 may be determined based on the other sizes such as the space between the plate portions 75 and 76 and the sizes of the openings 77 and 78.

The first and third walls 81 and 83 are placed substantially in parallel with the YZ plane, and the second and fourth walls 82 and 84 are placed substantially in parallel with the XZ plane. Each first wall 81 is substantially orthogonal to the fourth walls 84 in contact therewith, and the second walls 82 are substantially orthogonal to the third walls 83. Hence, each plane including the opening 72 or 74 is substantially orthogonal to each plane including the opening 73.

The first wall 81 is formed between the adjacent first space 53 and second space 54, and the adjacent first space 53 and second space 54 are connected to each other by the opening 72 of this first wall 81. The second wall 82 is formed between the second space 54 and third space 55, and the second space 54 and the third space 55 are connected to each other by the opening 73 of this second wall 82.

One ejection orifice 61 is positioned under each opening 78 of the second plate portion 76, and the through holes 71 (first spaces 53) and the ejection orifices 61 are in one-to-one correspondence. In a view in the Y-axis direction, each ejection orifice 61 is positioned substantially right below the center of the corresponding opening 78.

Still, the correspondence relation between the through holes 71 (first spaces 53) and the ejection orifices 61 is not particularly limited. For example, multiple through holes 71 (first spaces 53) may be positioned to correspond to one ejection orifice 61, or one through hole 71 (first space 53) may be positioned to correspond to multiple ejection orifices 61. Also, in a view in the Y-axis direction, each ejection orifice 61 may be designed to be positioned off the position right below the center of the corresponding opening 78.

Here, "the through hole 71 (first space 53) corresponding to the ejection orifice 61" means a through hole 71 (first space 53) designed to allow vapor deposition particles ejected from this ejection orifice 61 to pass therethrough.

Below each through hole 71 (first space 53), the vapor deposition streams 56 ejected from the ejection orifice 61 rises up with a certain spread (directivity). Some of the vapor deposition particles in the vapor deposition streams 56 can pass through the opening 78, the first space 53, and the opening 77 in the stated order to reach the mask 65. Meanwhile, the rest of the vapor deposition particles adhere to the lower surface of the second plate portion 76, the first walls 81, or the fourth walls 84, or pass through the openings 72 to enter the limiting component 70, failing to pass through the through hole 71 to reach the mask 65. Also, since openings 66 are formed in the mask 65, some of the vapor deposition particles having reached the mask 65 can pass through the openings 66 of the mask 65, and adhere to the substrate 90, forming a patterned thin film 91. The limiting component 70 also suppresses passing of each vapor deposition stream 56 through the neighboring through holes. In this manner, the limiting component 70 provided can suppress an unnecessary increase in the incident angle of the vapor deposition streams 56 to the substrate 90, and improve the directivity in the X-axis direction of the vapor deposition particles entering the substrate 90. As a result, the level of the blurs of the patterned thin film 91 can be suppressed.

From this viewpoint, the vapor deposition particles entering each opening 66 of the mask 65 are preferably limited to those ejected from the same ejection orifice 61. That is, it is preferred that vapor deposition particles ejected from different ejection orifices 61 do not enter one opening 66.

The limiting component 70 preferably includes a cooling system (cooling device, not illustrated). Thereby, re-evaporation of the vapor deposition particles adhering to the limiting component 70 can be suppressed. The specific structure of the cooling system is not particularly limited, and specific examples thereof include a pipe capable of allowing a cooling medium such as water to pass therethrough, and a cooling element such as a Peltier device. The position and method for installation of the cooling system are not particularly limited. For example, the cooling system may be placed on the upper surface of each plate portion 75 or 76.

Each opening 66 of the mask 65 has a shape that is long in the Y-axis direction and short in the X-axis direction (for example, a rectangle (slit)), and is positioned substantially in parallel with the Y-axis direction. Some of vapor deposition particles in the vapor deposition stream 56 having reached the mask 65 pass through the openings 66 to reach the substrate 90, and the rest of the particles are blocked by the mask 65. Therefore, the vapor deposition particles accumulate on the substrate 90 in a pattern corresponding to the openings 66 of the mask 65.

The mask 65 is smaller than the substrate 90, and at least one side of the mask 65 is shorter than the corresponding side of the vapor deposition region in the substrate 90. Thereby, the mask 65 can be easily produced, and the mask 65 is prevented from being deflected due to the weight thereof. In order to prevent the substrate 90 from being damaged during scanning of the substrate 90, the mask 65 is arranged apart from the substrate 90, and a space (gap) of a predetermined size is provided between the mask 65 and the substrate 90. The size of the gap is not particularly limited, and can be appropriately set. For example, this gap may be about the same as the gap between the mask and the substrate set in the conventional scanning vapor deposition.

Also during vapor deposition, the space between the mask 65 and the surface on which each ejection orifice 61 is formed is maintained to a predetermined size. This space is not particularly limited, and can be appropriately set. For example, this space may be about the same as the space between the mask and the surface on which the ejection orifice is formed in the conventional scanning vapor deposition.

In the light-emitting layer vapor deposition step S3, vapor deposition is performed three times to form the light-emitting layers 23R, 23G, and 23B in three colors in order. At each time of vapor deposition, the vapor deposition particles are allowed to adhere to the substrate 90 while the substrate 90 is moved (scanned) relative to the vapor deposition unit 50 including components such as the vapor deposition source 60, so that the stripe-patterned thin film 91 is formed as the light-emitting layer 23R, 23G or 23B.

During vapor deposition, the substrate 90 held by the holding system 51 is moved (scanned) above the mask 65 at a certain speed in the Y-axis direction by the moving system 52. At this time, the substrate 90 is held with a certain space from the mask 65, i.e., is held apart from the mask 65. Since the vapor deposition source 60, the limiting plate 70, and the mask 65 are integrated into the vapor deposition unit 50, these components are fixed during vapor deposition, and the positional relation between these components is substantially constant. Here, both of the substrate 90 and the vapor deposition unit 50 may be moved, or the vapor deposition unit 50 may be moved while the substrate 90 is fixed. The thickness of the film can be appropriately changed by changing the speed of scanning or the number of times of scanning. During vapor deposition, the pressure in the vacuum chamber is reduced to be set to a low-pressure state.

In the present embodiment, the first space 53 is connected to the second space 54. Thus, unnecessary vapor deposition particles which should be controlled by the limiting component 70 are allowed to enter the second space 54, i.e., the inside of the limiting component 70, from the first space 53, and the density of the vapor deposition particles in the first space 53 can be reduced. Accordingly, the probability of collision of the vapor deposition particles and dispersion of the vapor deposition particles in the first space 53 can be decreased.

The second space 54 is connected to the third space 55. Thereby, at least some of the vapor deposition particles having entered the second space 54 can be discharged to the third space 55 outside the limiting component 70, and thus an increase in the pressure in the limiting component 70 can be suppressed. Accordingly, the probability of collision of the vapor deposition particles and dispersion of the vapor deposition particles can be further decreased.

Furthermore, the vapor deposition particles having entered the second space 54 can be made to adhere to the inside of the limiting component 70, such as the lower surface of the first plate portion 75. Hence, even when the adhering vapor deposition particles re-evaporate due to the temperature increase in the limiting component 70, the re-evaporated vapor deposition particles can be prevented from travelling toward the mask 65.

As described above, the present embodiment can suppress an unnecessary spread in the X-axis direction of the vapor deposition streams 56 having passed the limiting component 70 even when the vapor deposition rate is high. Accordingly, generation of unexpected blurs (hereinafter, also referred to as unnecessary blurs) in the patterned thin film 91 to be formed can be suppressed, and generation of ghosts can be suppressed. That is, the pattern can be transferred with high precision.

The vapor deposition particles having entered the third space 55 eventually adhere to the walls of the vacuum chamber, and are captured. Also, since the density of the vapor deposition particles is low when the particles are near the walls of the vacuum chamber, dispersion of vapor deposition particles hardly occurs. Accordingly, the possibility that the vapor deposition particles having entered the third space 55 adversely affect the patterned thin film 91 is very low.

Figure 12:
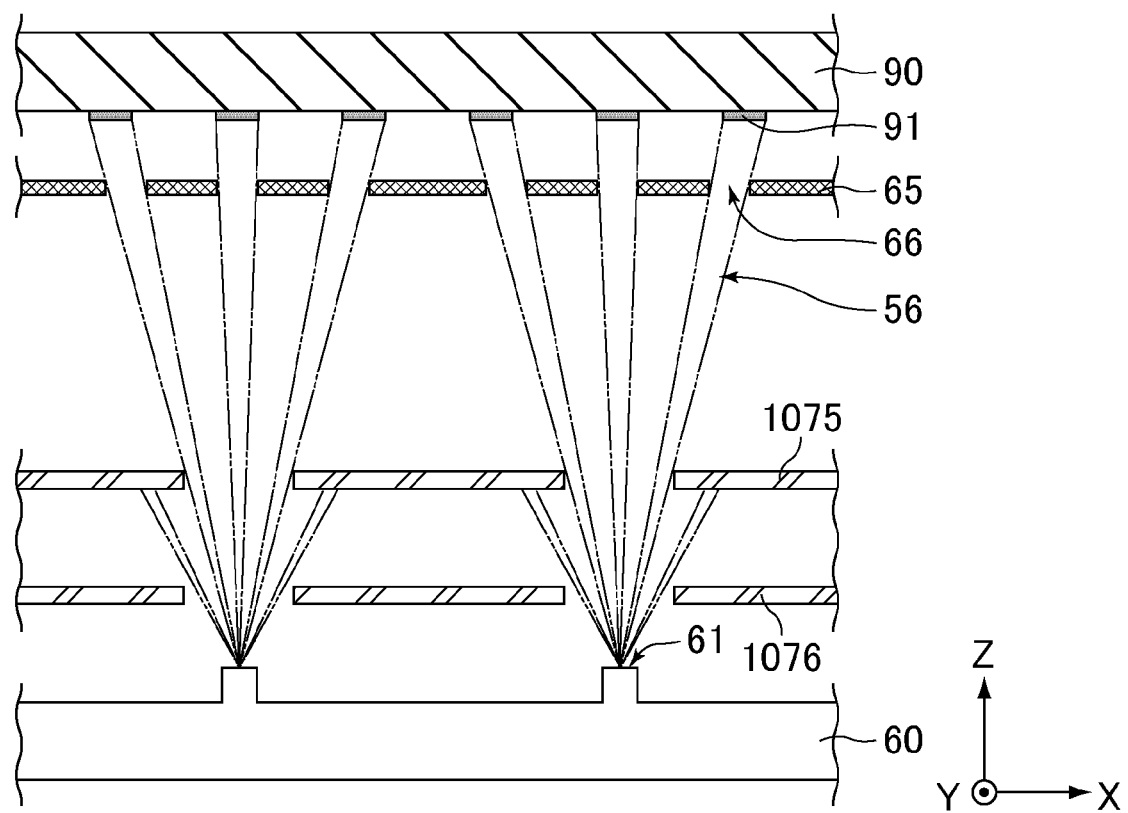
FIG. 12 is a schematic cross-sectional view of a vapor deposition apparatus in Comparative Embodiment 1, illustrating a cross section perpendicular to the scanning direction of the substrate.
Figure 13:
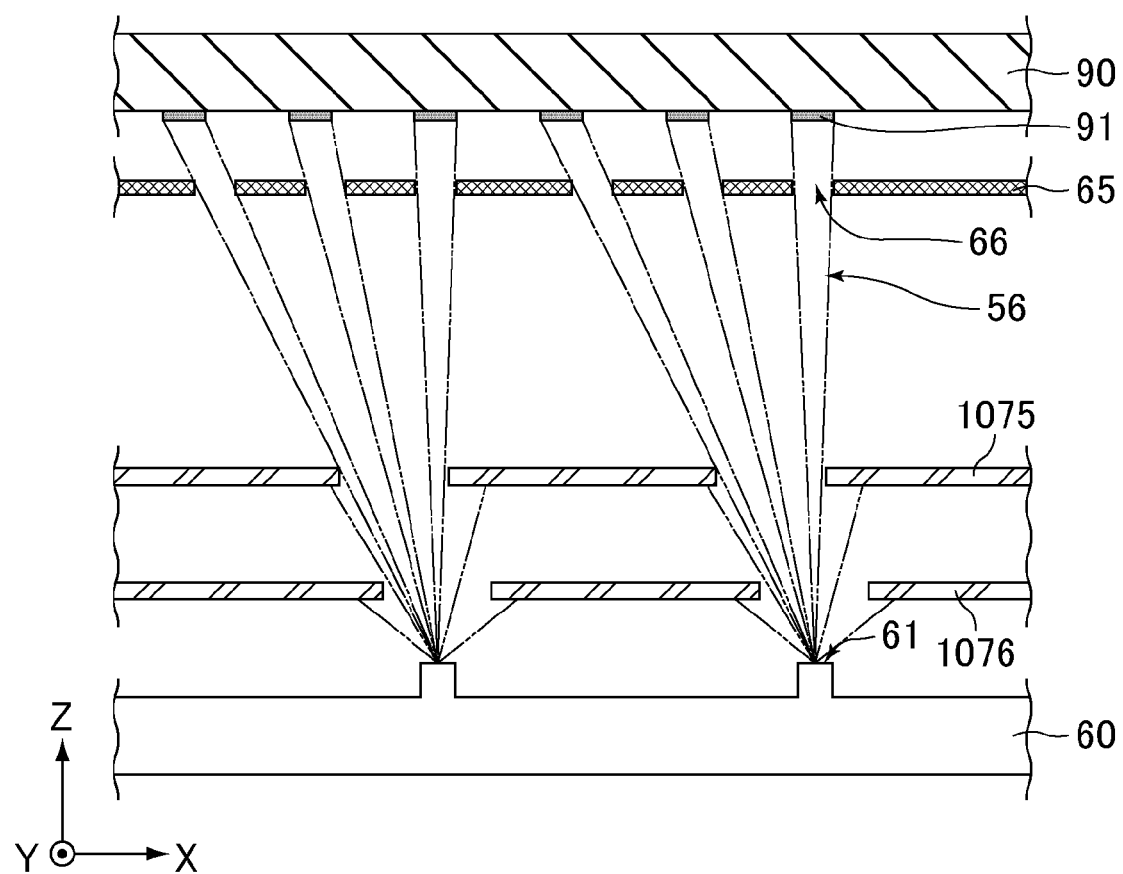
FIG. 13 is a schematic cross-sectional view of the vapor deposition apparatus in Comparative Embodiment 1, illustrating a cross section perpendicular to the scanning direction of the substrate.

FIG. 12 and FIG. 13 each are a schematic cross-sectional view of a vapor deposition apparatus in Comparative Embodiment 1, illustrating a cross section perpendicular to the scanning direction of the substrate. FIG. 13 shows the state where the limiting plates are misaligned.

As illustrated in FIG. 12, the present comparative embodiment is substantially the same as Embodiment 1 except that two kinds of limiting plates 1075 and 1076 are separately placed instead of the limiting component 70. In the present comparative embodiment, the limiting plates 1075 and 1076 are required to be precisely aligned when installed or changed to new ones. Therefore, in the case of repeatedly using the limiting plates 1075 and 1076 for a long period of time, there is a high possibility that the limiting plates 1075 and/or 1076 are placed off the predetermined positions. Misalignment of the limiting plate 1075 and/or the limiting plate 1076 changes the direction of the vapor deposition streams 56 to cause the vapor deposition particles to travel to undesired parts, which leads to a failure to form a uniform thin film.

In contrast, in the present embodiment, since the first plate portion 75 is integrated with the second plate portion 76 by the joint portions 80, the first plate portion 75 and the second plate portion 76 are not required to be aligned when the limiting component 70 is installed or changed to new one. Thereby, the possibility of formation of an uneven thin film due to misalignment can be decreased.

In the present embodiment, the limiting component 70 including the first plate portion 75 provided with the openings 77 and the second plate portion 76 provided with the openings 78 is used. Accordingly, compared to the case in which the limiting plates are placed in the direction of vapor deposition streams as described in Patent Literature 1, the alignment precision can be easily secured, and the structure of the cooling system can be further simplified.

Also, since the cooling effect is small in Comparative Embodiment 1, the temperature of the limiting plate 1076 on the vapor deposition source 60 side tends to increase, and the vapor deposition particles adhering to the limiting plate 1076 tend to re-evaporate. It is therefore highly possible that unnecessary blurs and ghosts are generated by the re-evaporated vapor deposition particles.

In contrast, in the present embodiment, since the first plate portion 75 is integrated with the second plate portion 76 by the joint portions 80, the heat capacity of the limiting component 70 can be increased, and the temperature of the limiting component 70 can be prevented from easily increasing. This effect is effectively exerted especially in the case of cooling the limiting component 70 by the cooling system. Accordingly, re-evaporation of the vapor deposition particles adhering to the limiting component 70 can be suppressed, and the possibility of generation of unnecessary blurs and ghosts can be decreased compared to Comparative Embodiment 1. Also, use of the integrated limiting component 70 can simplify the structure of the cooling system compared to the case in which the two kinds of the limiting plates 1075 and 1076 are separately placed.

Furthermore, in the present embodiment, the limiting component 70 includes the first and second walls 81 and 82 as the joint portions 80. The first walls 81 each are provided between the first space 53 and the second space 54, and the first space 53 is connected to the second space 54 via the opening 72 of the first wall 81. The second walls 82 each are provided between the second space 54 and the third space 55, and the second space 54 is connected to the third space 55 via the opening 73 of the second wall 82. Therefore, the heat capacity of the limiting component 70 can be further increased. Accordingly, the possibility of generation of unnecessary blurs and ghosts can be further decreased compared to the later-described Embodiments 5 and 6.

The present embodiment is substantially the same as Embodiment 1 except that a different limiting component is used. Hence, in the present embodiment, the unique features of the present embodiment are mainly described, and the same points as in Embodiment 1 are not described. Also, components having the similar or the same function in the present embodiment and Embodiment 1 are provided with the same reference sign, and the component in the present embodiment is not described.

Figure 14:
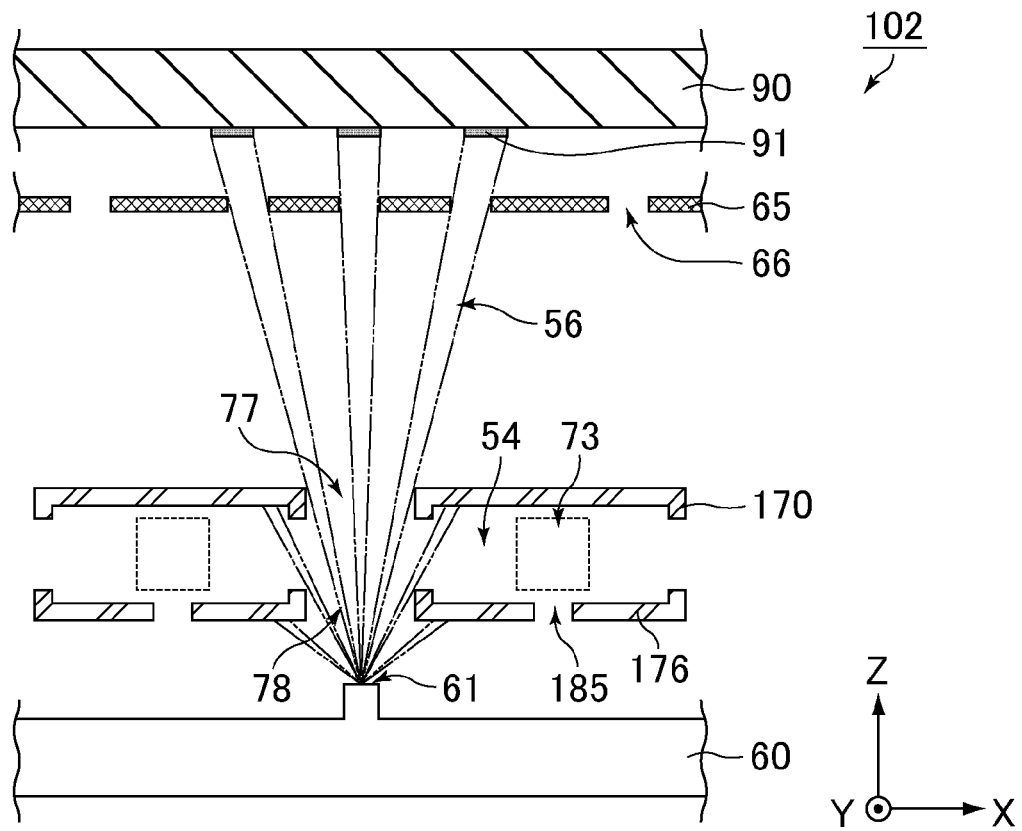
FIG. 14 is a schematic cross-sectional view of the vapor deposition apparatus in Embodiment 2, illustrating a cross section perpendicular to the scanning direction of the substrate.
Figure 15:
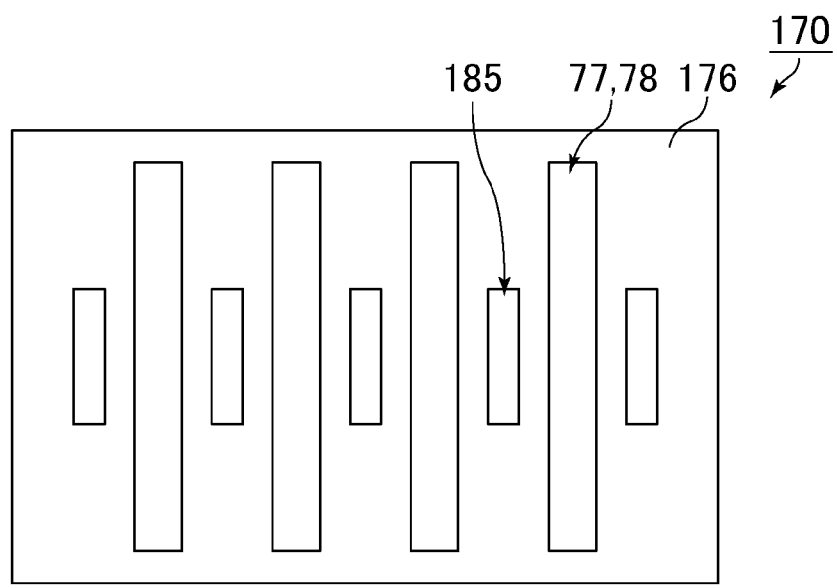
FIG. 15 is a bottom view of a limiting component in a vapor deposition apparatus in Embodiment 2.

FIG. 14 is a schematic cross-sectional view of the vapor deposition apparatus in Embodiment 2, illustrating a cross section perpendicular to the scanning direction of the substrate. FIG. 15 is a bottom view of a limiting component in a vapor deposition apparatus in Embodiment 2.

As illustrated in FIGS. 14 and 15, a vapor deposition apparatus 102 in the present embodiment is provided with a limiting component 170 instead of the limiting component 70. The limiting component 170 is substantially the same as the limiting component 70, except for including a second plate portion 176 instead of the second plate portion 76. The second plate portion 176 is substantially the same as the second plate portion 76, except that second openings 185 as well as the openings 78 are formed below the first plate portion 75.

Each second opening 185 faces a region of the first plate portion 75 other than the openings 77 of the first plate portion 75. That is, in a view in the Z-axis direction, at least part of each second opening 185 overlaps at least part of a region of the first plate portion 75 other than the openings 77 of the first plate portion 75. Preferably, in a view in the Z-axis direction, the whole (entire region) of each second opening 185 overlaps part of a region of the first plate portion 75 other than the openings 77 of the first plate portion 75.

All the second openings 185 are formed to have substantially the same planar shape with substantially the same size, and the planar shape of each second opening 185 is a rectangle or a square. The planar shape of each opening 185 is not particularly limited to a rectangle or a square, and the planar shapes of the second openings 185 can be appropriately set independently of each other. Also, the sizes of the second openings 185 are not particularly limited, and can be appropriately set independently of each other. The sizes of the second openings 185 may be determined based on other sizes such as the sizes of the openings 77 and 78 and the intervals between the openings 77 and 78.

In the present embodiment, the vapor deposition particles having entered the second space 54 can go out of the limiting component 70 through the second openings 185 as well as the openings 73. This structure enables further suppression of an increase in the pressure in the limiting component 70 and further lowering of the probability of collision of the vapor deposition particles and dispersion of the vapor deposition particles, compared to Embodiment 1. The present embodiment therefore enables further suppression of generation of unnecessary blurs and ghosts and transfer of the pattern with high precision, compared to Embodiment 1.

The present embodiment is substantially the same as Embodiment 1 except that a different limiting component is used and that plates are further provided above the limiting component. Hence, in the present embodiment, the unique features of the present embodiment are mainly described, and the same points as in Embodiment 1 are not described. Also, components having the similar or the same function in the present embodiment and Embodiment 1 are provided with the same reference sign, and the component in the present embodiment is not described.

Figure 16:
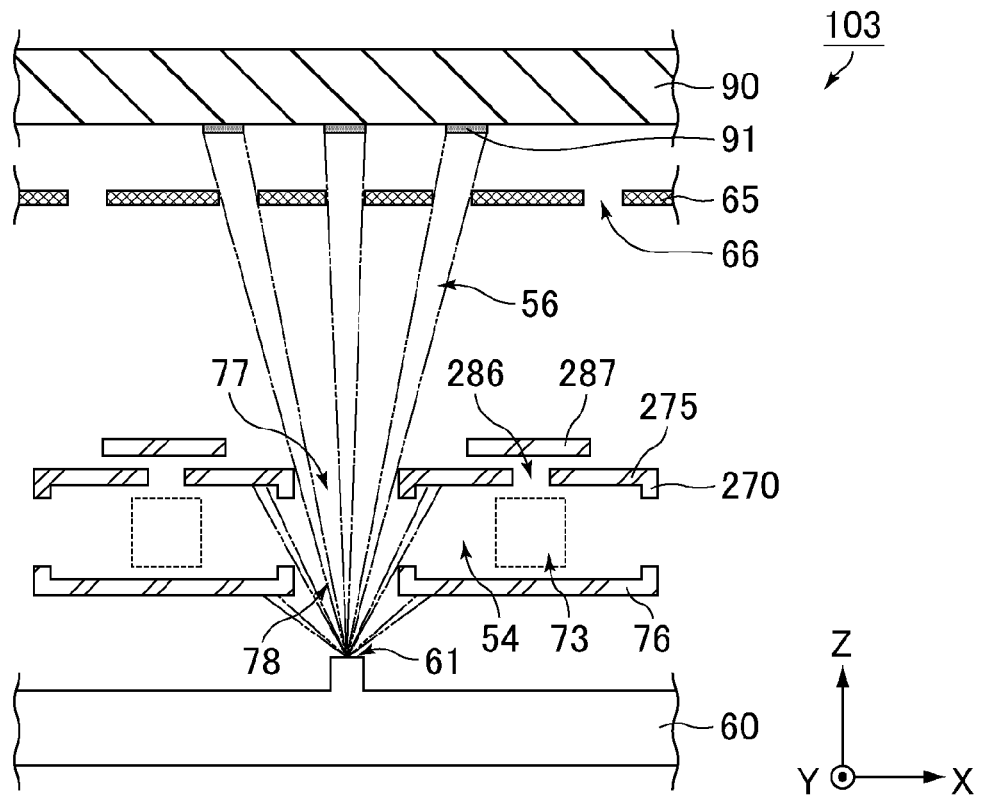
FIG. 16 is a schematic cross-sectional view of a vapor deposition apparatus in Embodiment 3, illustrating a cross section perpendicular to the scanning direction of the substrate.
Figure 17:
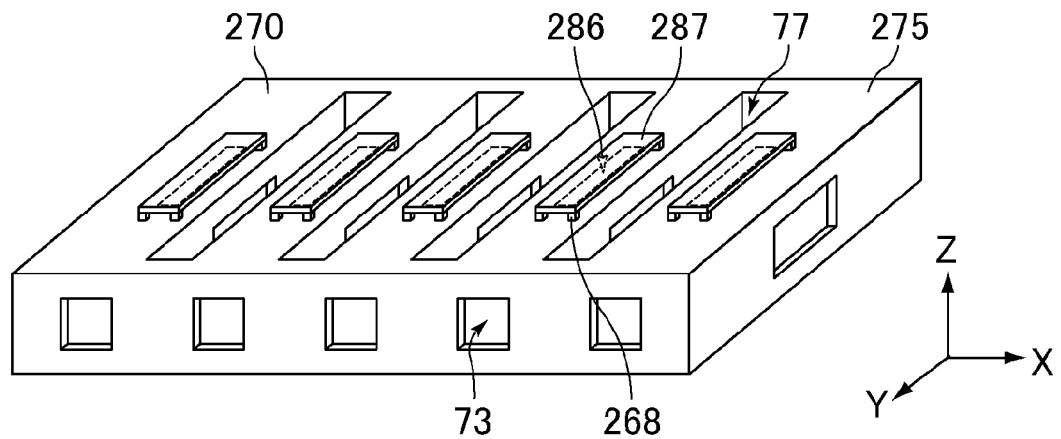
FIG. 17 is a perspective view schematically illustrating a limiting component in the vapor deposition apparatus in Embodiment 3.
Figure 18:
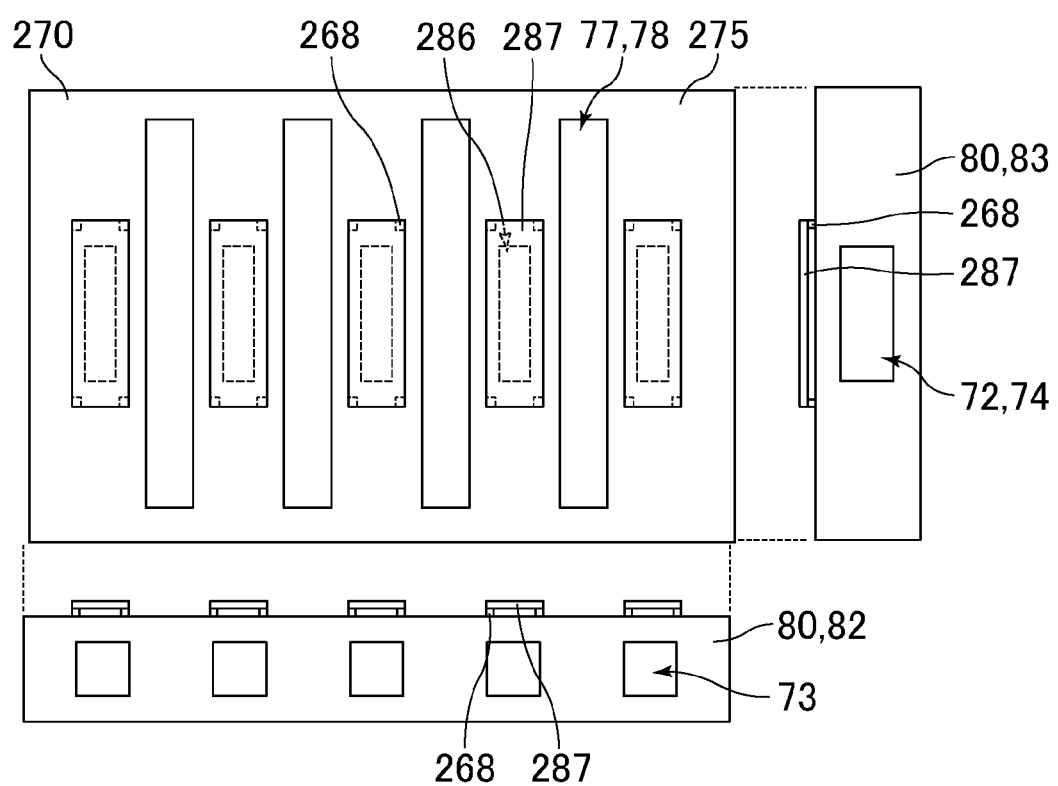
FIG. 18 shows a plan view, a front view, and a right-side view of the limiting component in the vapor deposition apparatus in Embodiment 3.

FIG. 16 is a schematic cross-sectional view of a vapor deposition apparatus in Embodiment 3, illustrating a cross section perpendicular to the scanning direction of the substrate. FIG. 17 is a perspective view schematically illustrating a limiting component in the vapor deposition apparatus in Embodiment 3. FIG. 18 shows a plan view, a front view, and a right-side view of the limiting component in the vapor deposition apparatus in Embodiment 3.

As illustrated in FIGS. 16 to 18, a vapor deposition apparatus 103 in the present embodiment is provided with a limiting component 270 instead of the limiting component 70. The limiting component 270 is substantially the same as the limiting component 70, except for including a first plate portion 275 instead of the first plate portion 75. The first plate portion 275 is substantially the same as the first plate portion 75, except that second openings 286 in addition to the openings 77 are formed above the second plate portion 76.

Each second opening 286 faces a region of the second plate portion 76 other than the openings 78 of the second plate portion 76. That is, in a view in the Z-axis direction, at least part of each second opening 286 overlaps at least part of a region of the second plate portion 76 other than the openings 78 of the second plate portion. Preferably, in a view in the Z-axis direction, the whole (entire region) of each second opening 286 overlaps part of a region of the second plate portion 76 other than the openings 78 of the second plate portion 76.

All the second openings 286 are formed to have substantially the same planar shape with substantially the same size, and the planar shape of each second opening 286 is a rectangle or a square. The planar shape of each opening 286 is not particularly limited to a rectangle or a square, and the planar shapes of the second openings 286 can be appropriately set independently of each other. Also, the sizes of the second openings 286 are not particularly limited, and can be appropriately set independently of each other. The sizes of the second openings 286 may be determined based on other sizes such as the sizes of the openings 77 and 78 and the intervals between the openings 77 and 78.

The vapor deposition apparatus 103 in the present embodiment is further provided with plates 287 between the first plate portion 275 and the mask 65. Each plate 287 is placed with a space from the first plate portion 275. One second opening 286 is positioned below each plate 287, and the plates 287 and the second openings 286 are in one-to-one correspondence.

Each plate 287 is larger than the corresponding second opening 286. Also, each plate 287 contains the whole (entire region) of the corresponding opening 286 in a view in the Z-axis direction.

All the plates 287 are formed to have substantially the same planar shape with substantially the same size, and the planar shape of each plate 287 is a rectangle or a square. The planar shape of each plate 287 is not particularly limited to a rectangle or a square, and the planar shapes of the plates 287 can be appropriately set independently of each other. Also, the sizes of the plates 287 are not particularly limited, and can be appropriately set independently of each other as long as they are larger than the corresponding second openings 286. The plates 287 preferably do not overlap the openings 77 in a view in the Z-axis direction, and each plate 287 is preferably smaller than the region between adjacent openings 77.

In the present embodiment, the vapor deposition particles having entered the second space 54 can go out of the limiting component 270 through the second openings 286 as well as the openings 73. This structure enables further suppression of an increase in the pressure in the limiting component 270 and further lowering of the probability of collision of the vapor deposition particles and dispersion of the vapor deposition particles, compared to Embodiment 1. The present embodiment therefore enables further suppression of generation of unnecessary blurs and ghosts and transfer of the pattern with high precision, compared to Embodiment 1.

The vapor deposition particles having passed through the second openings 286 usually adhere to the plates 287, and therefore do not cause unnecessary blurs and ghosts. Also, in the case that the vapor deposition particles are dispersed near the second openings 286, almost all the substances (vapor deposition particles) not in parallel with the plates 187 adhere to the plates 287, while the substances (vapor deposition particles) substantially in parallel with the plates 287 travel substantially in parallel with the plates 287 and thus cannot reach the substrate 90. Accordingly, even when dispersion occurs, the vapor deposition particles having passed through the second openings 286 hardly cause unnecessary blurs and ghosts.

The plates 287 may or may not be integrated with the first plate portion 275. Still, the cooling effect is higher in the case where the plates 287 are integrated with the first plate portion 275 than in the case where they are not integrated, and therefore re-evaporation of the vapor deposition particles adhering to the limiting component 270 can be further suppressed.

From this viewpoint, the limiting component 270 preferably further includes joint portions 268 combining each plate 287 with the first plate portion 275. The joint portions 268 are placed around the second openings 286 to combine the ends of the plates 187 with the first plate portion 275. The specific shape of the joint portions 268 is not particularly limited, and the joint portions 268 may be, for example, pillars having a cylindrical shape or a quadrangular prism shape, or walls having a flat-plate-like shape.

The present embodiment is substantially the same as Embodiment 1 except that a different limiting component is used. Hence, in the present embodiment, the unique features of the present embodiment are mainly described, and the same points as in Embodiment 1 are not described. Also, components having the similar or the same function in the present embodiment and Embodiment 1 are provided with the same reference sign, and the component in the present embodiment is not described.

Figure 19:
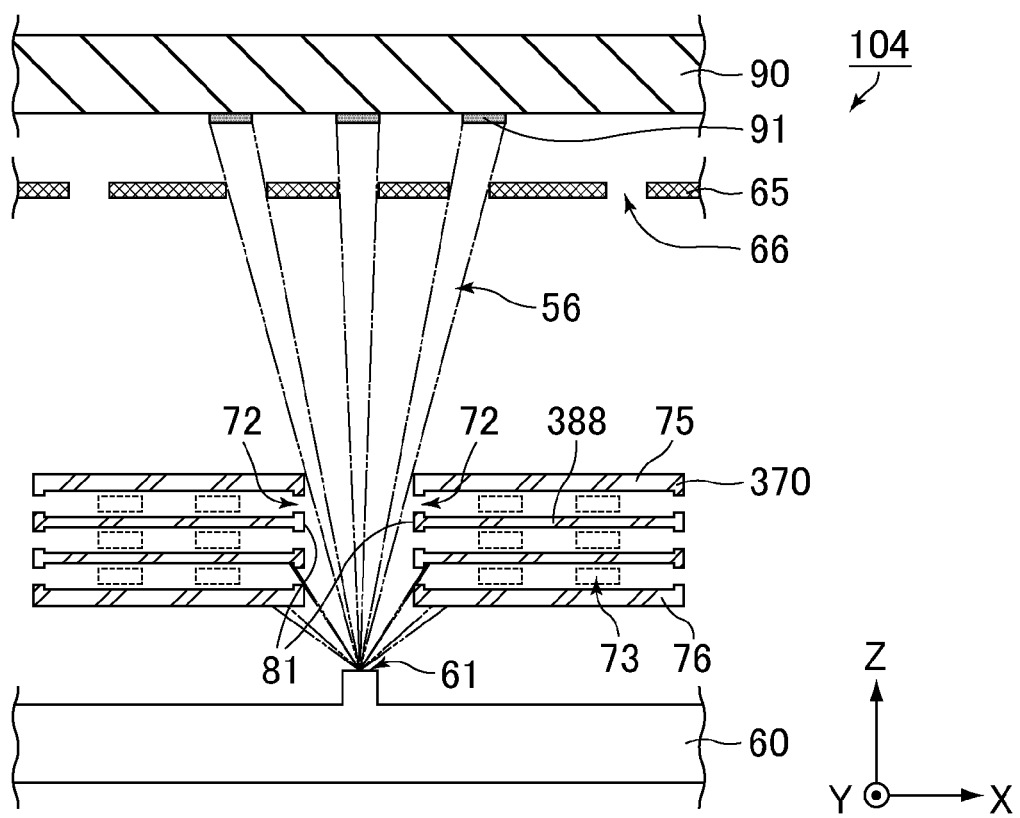
FIG. 19 is a schematic cross-sectional view of a vapor deposition apparatus in Embodiment 4, illustrating a cross section perpendicular to the scanning direction of the substrate.
Figure 20:
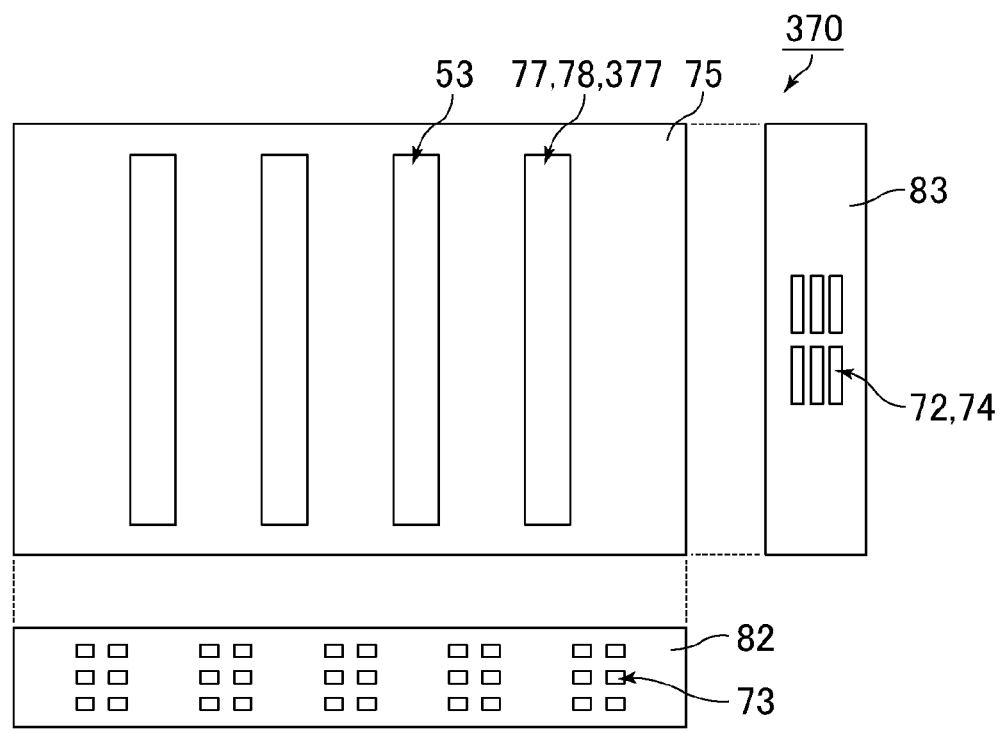
FIG. 20 shows a plan view, a front view, and a right-side view of a limiting component in the vapor deposition apparatus in Embodiment 4.

FIG. 19 is a schematic cross-sectional view of a vapor deposition apparatus in Embodiment 4, illustrating a cross section perpendicular to the scanning direction of the substrate. FIG. 20 shows a plan view, a front view, and a right-side view of a limiting component in the vapor deposition apparatus in Embodiment 4.

As illustrated in FIGS. 19 and 20, a vapor deposition apparatus 104 in the present embodiment is provided with a limiting component 370 instead of the limiting component 70.

The limiting component 370 differs from the limiting component 70 in the following points. That is, the limiting component 370 includes one or more third plate portions 388 provided between the first plate portion 75 and the second plate portion 76. The third plate portions 388 are flat-plate-like components provided with openings, and adjacent plate portions are spaced from each other. The third plate portions 388 are placed substantially in parallel with the XY plane, and the plate portions 75, 76, and 388 are placed substantially in parallel with each other. The third plate portions 388 are provided with m number of openings 377 corresponding to the openings 77 of the first plate portion 75 and the openings 78 of the second plate portion 76.

The openings 377 are formed at substantially the same pitch as the ejection orifices 61 in the X-axis direction, and each opening 377 faces the corresponding openings 77 and 78. That is, in a view in the Z-axis direction, at least part of each opening 377 overlaps at least part of the corresponding opening 77 and at least part of the corresponding opening 78.

All the openings 377 are formed to have substantially the same planar shape with substantially the same size, and the planar shape of each opening 377 is a rectangle or a square. Each opening 377 is formed at substantially the same position as the corresponding openings 77 and 78 in a view in the Z-axis direction, and the outline of each opening 377 in a view in the Z-axis direction substantially conforms to the outline of each of the corresponding openings 77 and 78.

Each opening 377 may be formed at a different position from the corresponding openings 77 and 78 in a view in the Z-axis direction. Also, the outline of each opening 377 may be positioned off the outlines of the corresponding openings 77 and 78 in a view in the Z-axis direction.

The planar shape of each opening 377 is not particularly limited to a rectangle or a square, and the planar shapes of the openings 377 can be appropriately set independently of each other. The planar shape of each opening 377 is usually a shape having two sides parallel to each other, and the two sides are usually parallel to the Y-axis direction. Also, the sizes of the openings 377 are not particularly limited, and can be appropriately set independently of each other. For example, each opening 377 may be of about the same size as the opening provided in the limiting plate used in the conventional scanning vapor deposition.

The openings 72 of the first wall 81 each are divided into regions. The openings 73 of the second wall 82 each are divided into regions. The openings 74 of the third wall 83 each are divided into regions.

As described above, in the present embodiment, each first wall 81 includes multiple openings 72, and each second wall 82 includes multiple openings 73. Thereby, the size of each opening 72 or 73 can be made smaller than that in Embodiment 1. The cooling effect of the limiting component 370 can therefore be effectively enhanced, so that re-evaporation of the vapor deposition particles adhering to the limiting component 370 can be effectively suppressed. As a result, the possibility of generation of unnecessary blurs and ghosts can be further decreased.

The present embodiment is substantially the same as Embodiment 1 except that a different limiting component is used. Hence, in the present embodiment, the unique features of the present embodiment are mainly described, and the same points as in Embodiment 1 are not described. Also, components having the similar or the same function in the present embodiment and Embodiment 1 are provided with the same reference sign, and the component in the present embodiment is not described.

Figure 21:
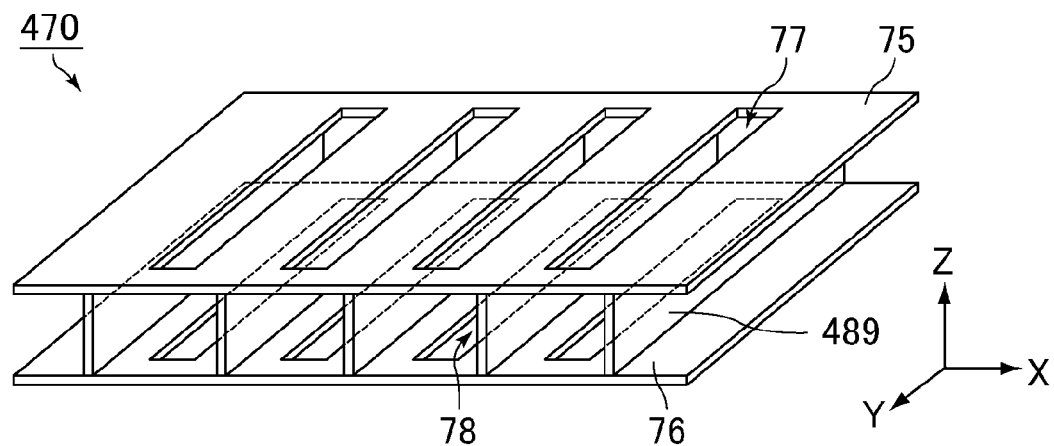
FIG. 21 is a perspective view schematically illustrating a limiting component in a vapor deposition apparatus in Embodiment 5.
Figure 22:
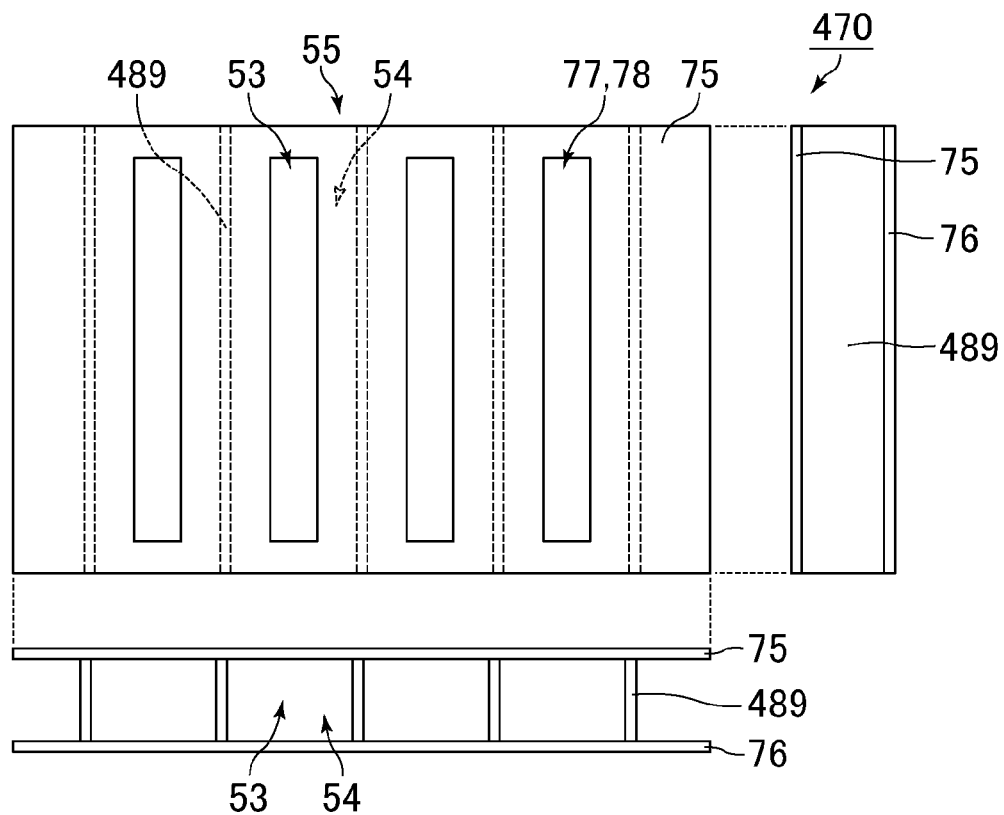
FIG. 22 shows a plan view, a front view, and a right-side view of the limiting component in the vapor deposition apparatus in Embodiment 5.

FIG. 21 is a perspective view schematically illustrating a limiting component in a vapor deposition apparatus in Embodiment 5. FIG. 22 shows a plan view, a front view, and a right-side view of the limiting component in the vapor deposition apparatus in Embodiment 5.

As illustrated in FIGS. 21 and 22, the vapor deposition apparatus in the present embodiment is provided with a limiting component 470 instead of the limiting component 70. The limiting component 470 is substantially the same as the limiting component 70 except that fifth walls 489 are provided as the joint portions instead of the first, second, third, and fourth walls 81, 82, 83, and 84.

Each fifth wall 489 is a flat-plate-like component provided with no openings, and is placed substantially in parallel with the YZ plane. In a view in the Z-axis direction, each opening 77 or 78 is positioned between two adjacent fifth walls 489, and the fifth walls 489 and the openings 77 and 78 are positioned at substantially equal intervals. Therefore, in the present embodiment, nothing blocks the passage between the first space 53 and the second space 54 and between the second space 54 and the third space 55.

The present embodiment achieves the same effect as Embodiment 1. However, Embodiment 1 is more preferable than the present embodiment in terms of cooling of the limiting component and alignment precision of the first plate portion and the second plate portion.

The present embodiment is substantially the same as Embodiment 1 except that a different limiting component is used. Hence, in the present embodiment, the unique features of the present embodiment are mainly described, and the same points as in Embodiment 1 are not described. Also, components having the similar or the same function in the present embodiment and Embodiment 1 are provided with the same reference sign, and the component in the present embodiment is not described.

Figure 23:
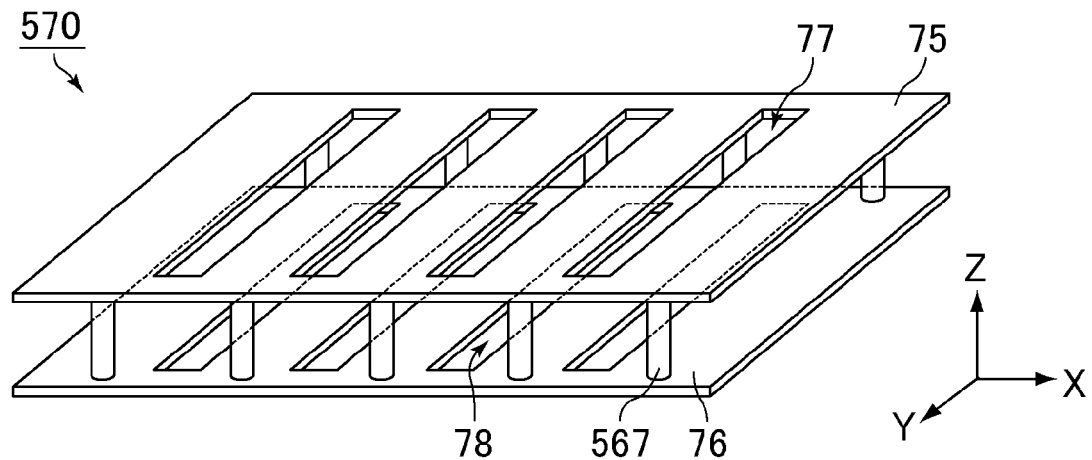
FIG. 23 is a perspective view schematically illustrating a limiting component in a vapor deposition apparatus in Embodiment 6.
Figure 24:
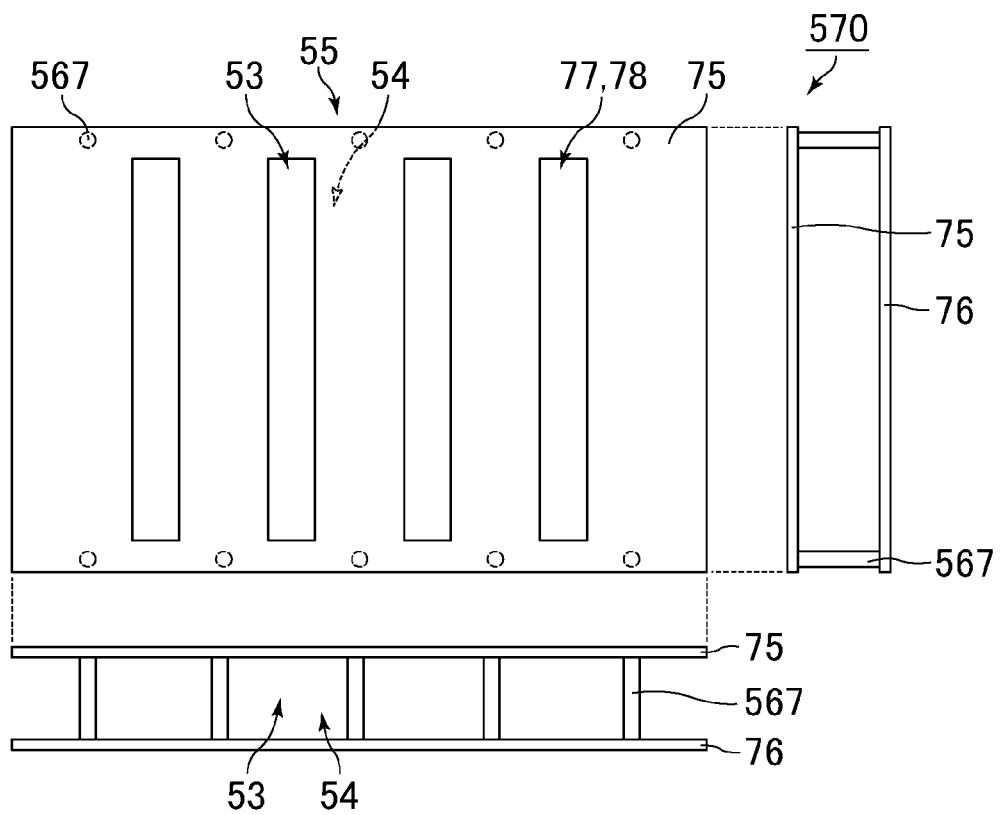
FIG. 24 shows a plan view, a front view, and a right-side view of the limiting component in the vapor deposition apparatus in Embodiment 6.

FIG. 23 is a perspective view schematically illustrating a limiting component in a vapor deposition apparatus in Embodiment 6. FIG. 24 shows a plan view, a front view, and a right-side view of the limiting component in the vapor deposition apparatus in Embodiment 6.

As illustrated in FIGS. 23 and 24, the vapor deposition apparatus in the present embodiment is provided with a limiting component 570 instead of the limiting component 70. The limiting component 570 is substantially the same as the limiting component 70 except that pillars 567 are provided as the joint portions instead of the first, second, third, and fourth walls 81, 82, 83, and 84.

Each pillar 567 is a cylindrical or quadrangular prism component, and the longitudinal direction thereof is substantially parallel to the Z-axis direction. The pillars 567 are placed along the ends of the first plate portions 75 and 76. Therefore, in the present embodiment, nothing blocks the passage between the first space 53 and the second space 54 and between the second space 54 and the third space 55.

The present embodiment achieves the same effect as Embodiment 1. However, Embodiment 1 is more preferable than the present embodiment in terms of cooling of the limiting component and alignment precision of the first plate portion and the second plate portion.

Hereinafter, other alternative examples of Embodiments 1 to 6 are described.

The flat-plate-like components described in Embodiments 1 to 6 may each have a shape other than a flat plate shape, and may be, for example, bent and/or curved, or may be a corrugated plate.

In Embodiments 1 to 6, the material of each part of the limiting component is not particularly limited, and can be appropriately selected. The method for producing the limiting component is not particularly limited either. For example, the individual parts may be separately produced, and they may be combined by welding.

The arrangement of the through holes provided in the limiting component is not particularly limited. For example, through holes may be arranged in a staggered pattern, or lines of through holes extending in the X-axis direction may be arranged in the Y-axis direction.

Also, the vapor deposition source, the limiting component, the mask, and the substrate may face any direction as long as they are arranged in the stated order. For example, the above vapor deposition unit may be placed upside down, and the vapor deposition source, the limiting plates, the mask, and the substrate may be arranged from the top in the stated order. Also, the above vapor deposition unit may be rotated by 90° with the Y-axis as the center, and the vapor deposition source, the limiting plates, the mask, and the substrate may be arranged horizontally.

The organic EL display device may be a monochrome display device, and each pixel may not be divided into sub-pixels. In this case, in the light-emitting layer vapor deposition step, the vapor deposition may be performed only once to form a light-emitting layer in only one color.

In vapor deposition steps other than the light-emitting layer vapor deposition step, patterned thin films may be formed in the same manner as in the light-emitting layer vapor deposition step. For example, the electron transport layer may be formed separately for the sub-pixels in the respective colors.

Furthermore, although the cases of forming a light-emitting layer of organic EL elements were described, the application of the vapor deposition apparatus in the present invention is not particularly limited to production of organic EL elements, and can be used for formation of various patterned thin films.

The above embodiments may be appropriately combined without departing from the spirit of the present invention. Also, the alternative examples of each embodiment may be combined with the other embodiments.

The present comparative embodiment is substantially the same as Embodiment 1 except that a limiting plate is used instead of the limiting component. Hence, in the present comparative embodiment, the unique features of the present embodiment are mainly described, and the same points as in Embodiment 1 are not described. Also, components having the similar or the same function in the present comparative embodiment and Embodiment 1 are provided with the same reference sign, and the component in the present comparative embodiment is not described.

Figure 25:
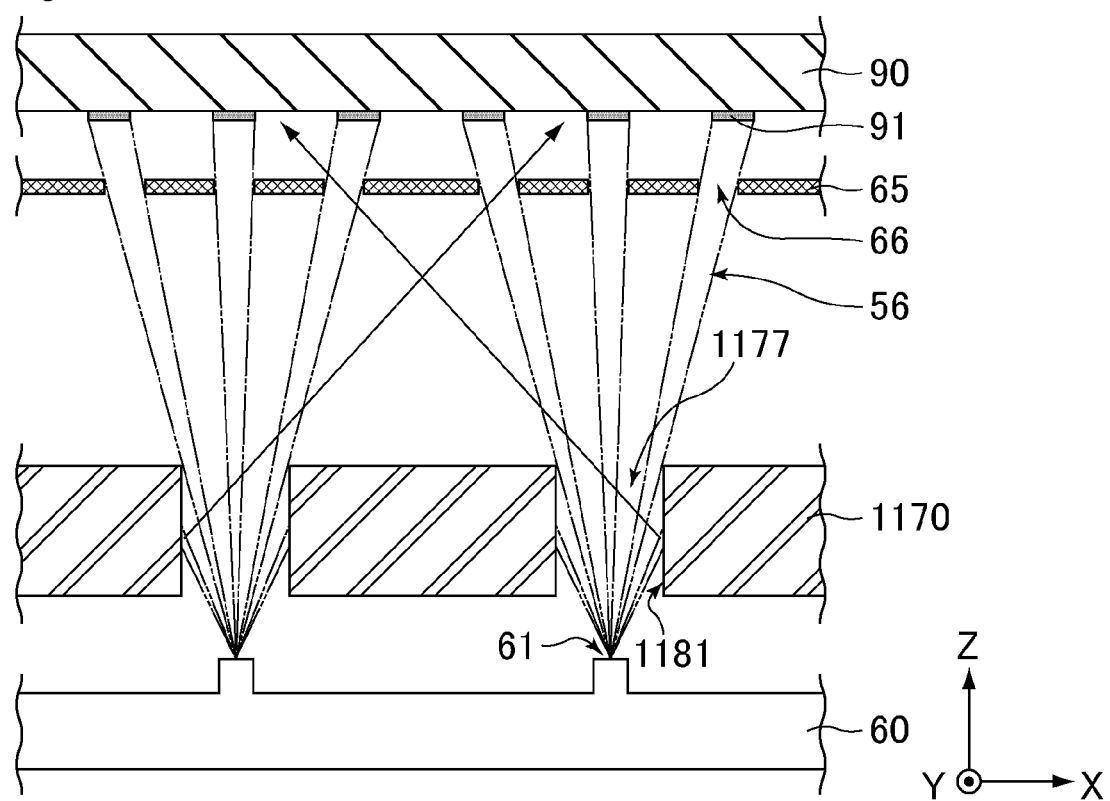
FIG. 25 is a schematic cross-sectional view of a vapor deposition apparatus in Comparative Embodiment 2, illustrating a cross section perpendicular to the scanning direction of the substrate.

FIG. 25 is a schematic cross-sectional view of a vapor deposition apparatus in Comparative Embodiment 2, illustrating a cross section perpendicular to the scanning direction of the substrate.

As illustrated in FIG. 25, the vapor deposition apparatus in the present comparative embodiment is provided with a limiting plate 1170 instead of the limiting component 70. The limiting plate 1170 is a component consisting of one thick plate, and is provided with openings 1177 corresponding to the ejection orifices 61.

In the present comparative embodiment, it is highly possible that collision of the vapor deposition particles and dispersion of the vapor deposition particles occur when the vapor deposition streams 56 pass through the openings 1177 in the limiting plate 1170. Also, vapor deposition particles having failed to pass through the openings 1177 and adhered to a side face 1181 of the limiting plate 1170 can re-evaporate upon a temperature increase of the limiting plate 1170. The re-evaporated vapor deposition particles are not controlled unlike the vapor deposition particles from the ejection orifices 61 immediately after the ejection, and the particles may travel in unexpected directions. These phenomena unnecessarily widen the vapor deposition streams 56 which should be controlled by the limiting plate 1170, after the vapor deposition streams 56 pass through the openings 1177. As a result, some of the particles in the stream reach a region in which a film is to be formed by the neighboring vapor deposition streams 56, producing unnecessary blurs and/or ghosts.

REFERENCE SIGNS LIST

1: Organic EL display device
2: Pixel
2R, 2G, 2B: Sub-pixel
10: TFT Substrate
11: Insulating substrate
12: TFT
13: Interlayer film
13a: Contact hole
14: Conductive line
15: Edge cover
15R, 15G, 15B: Opening
20: Organic EL element
21: First electrode
22: Hole injection/hole transport layer (organic layer)
23R, 23G, 23B: Light-emitting layer (organic layer)

24: Electron transport layer (organic layer)
25: Electron injection layer (organic layer)
26: Second electrode
30: Adhesive layer
40: Sealing substrate
50: Vapor deposition unit
51: Holding system (holding tool)
52: Moving system (moving machine)
53: First space
54: Second space
55: Third space
56: Vapor deposition stream
60: Vapor deposition source
61: Ejection orifice
62: Nozzle
65: Mask (vapor deposition mask)
70, 170, 270, 370, 470, 570: Limiting component
71: Slot
66, 72, 73, 74, 77, 78, 377: Opening
75, 275: First plate portion
76, 176: Second plate portion
80: Joint portion
81: First wall
82: Second wall
83: Third wall
84: Fourth wall
90: Substrate (film-formation target substrate)
91: Patterned thin film
101, 102, 103, 104: Vapor deposition apparatus
185, 286: Second opening
268: Joint portion
287: Plate
388: Third plate portion
489: Fifth wall
567: Pillar

The invention claimed is:

1. A vapor deposition apparatus for forming a patterned thin film on a substrate, the apparatus comprising:
a vapor deposition unit including a vapor deposition source, a limiting component, and a mask; and
a moving system configured to move one of the substrate and the vapor deposition unit relative to the other of the substrate and the vapor deposition unit in a first direction orthogonal to the normal direction of the substrate, with the substrate being spaced from the mask,
the vapor deposition source, the limiting component, the mask, and the substrate being arranged in the stated order,
the limiting component including:
a first plate portion;
a second plate portion provided with a space from the first plate portion; and
a joint portion combining the first plate portion with the second plate portion,
the first plate portion being provided with an opening,
the second plate portion being provided with an opening that faces the opening of the first plate portion,
the vapor deposition apparatus including a first space between the opening of the first plate portion and the opening of the second plate portion,
the vapor deposition apparatus including a second space between the first plate portion and the second plate portion, the second space being adjacent to the first space in a second direction that is perpendicular to the normal direction of the substrate and to the first direction,
the first space being connected to the second space,
the vapor deposition apparatus including a third space that is adjacent to the second space in the first direction and is in the outside of the limiting component, and
the second space being connected to the third spaces,
wherein there are a plurality of the joint portions,
the limiting component includes, as the joint portions, a first wall and a second wall each provided with an opening,
the first wall is provided between the first space and the second space,
the second wall is provided between the second space and the third space,
the first space is connected to the second space via the opening of the first wall,
the second space is connected to the third space via the opening of the second wall, and
wherein the first plate portion is provided with a second opening,
the second opening of the first plate portion faces a region of the second plate portion other than the opening of the second plate portion,
the vapor deposition apparatus further comprises a plate placed with a space from the first plate portion between the first plate portion and the mask, and
the plate is larger than the second opening of the first plate portion, and contains the whole second opening in a view in the normal direction of the substrate.

2. The vapor deposition apparatus of claim 1,
wherein there are a plurality of the openings of the first wall, and
there are a plurality of the openings of the second wall.

3. The vapor deposition apparatus of claim 1,
wherein the second plate portion is provided with a second opening, and
the second opening of the second plate portion faces a region of the first plate portion other than the opening of the first plate portion.

4. The vapor deposition apparatus of claim 1, wherein the limiting component further includes a joint portion that combines the plate with the first plate portion.

5. A vapor deposition method comprising
a vapor deposition step of forming a patterned thin film on a substrate,
the vapor deposition step being performed with the vapor deposition apparatus of claim 1.

6. A method for producing an organic electroluminescent element, comprising
a vapor deposition step of forming a patterned thin film with the vapor deposition apparatus of claim 1.

* * * * *